US012672312B2

(12) United States Patent
Siao et al.

(10) Patent No.: US 12,672,312 B2
(45) Date of Patent: Jun. 30, 2026

(54) INTEGRATED CIRCUIT DEVICE AND MANUFACTURING METHOD THEREOF

(71) Applicant: TAIWAN SEMICONDUCTOR MANUFACTURING COMPANY, LTD., Hsinchu (TW)

(72) Inventors: Yi-Syuan Siao, Changhua City (TW); Chien-Yu Lin, Yilan County (TW); Meng-Han Chou, Hsinchu City (TW); Su-Hao Liu, Chiayi County (TW); Chi On Chui, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 413 days.

(21) Appl. No.: 18/317,764

(22) Filed: May 15, 2023

(65) Prior Publication Data

US 2024/0387669 A1     Nov. 21, 2024

(51) Int. Cl.
| | |
|---|---|
| *H10D 30/67* | (2025.01) |
| *H10D 30/01* | (2025.01) |
| *H10D 30/43* | (2025.01) |
| *H10D 62/10* | (2025.01) |
| *H10D 64/01* | (2025.01) |
| *H10D 84/01* | (2026.01) |
| *H10D 84/03* | (2025.01) |
| *H10D 84/85* | (2025.01) |

(52) U.S. Cl.
CPC ....... *H10D 30/6735* (2025.01); *H10D 30/014* (2025.01); *H10D 30/43* (2025.01); *H10D 30/6757* (2025.01); *H10D 62/121* (2025.01);

*H10D 64/017* (2025.01); *H10D 84/0167* (2025.01); *H10D 84/038* (2025.01); *H10D 84/85* (2025.01)

(58) Field of Classification Search
CPC .. H10D 30/014; H10D 30/43; H10D 30/6735; H10D 30/6757; H10D 30/797; H10D 62/121; H10D 62/151; H10D 64/017; H10D 84/0167; H10D 84/017; H10D 84/038; H10D 84/83; H10D 84/85
USPC ........................................ 257/401
See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |

(Continued)

*Primary Examiner* — Fazli Erdem
(74) *Attorney, Agent, or Firm* — Maschoff Brennan

(57) ABSTRACT

A method for fabricating an integrated circuit device includes forming first epitaxial stack comprising a first sacrificial layer and a first channel layer over a substrate; forming a second epitaxial stack comprising a second sacrificial layer and a second channel layer over the first epitaxial stack; etching a recess in the first and second epitaxial stacks, wherein the recess exposes end surfaces of the first and second channel layers; performing a first ion implantation process to form a first lightly doped region; performing a second ion implantation process to form a second lightly doped region, wherein a tilt angle of the second ion implantation process is greater than a tilt angle of the first ion implantation process; forming first and second source/drain epitaxial features in the recess; and replacing the first and the second sacrificial layers with a high-k/metal gate structure.

20 Claims, 34 Drawing Sheets

(56)          References Cited

U.S. PATENT DOCUMENTS

| | | | |
|---|---|---|---|
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 2021/0391443 | A1* | 12/2021 | Wang ................. H10D 84/0158 |
| 2022/0384202 | A1* | 12/2022 | Lin ................... H01L 21/31138 |

\* cited by examiner

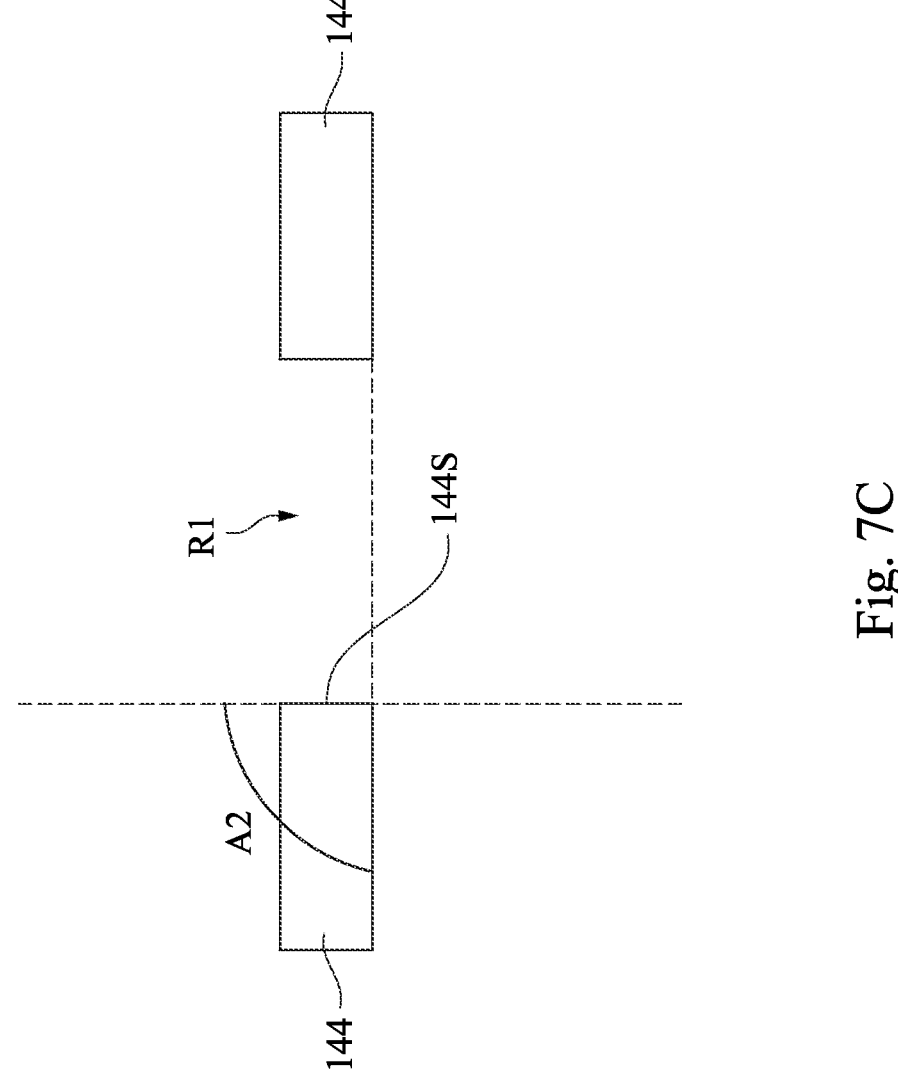
Fig. 7C
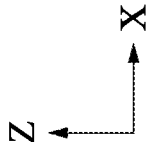

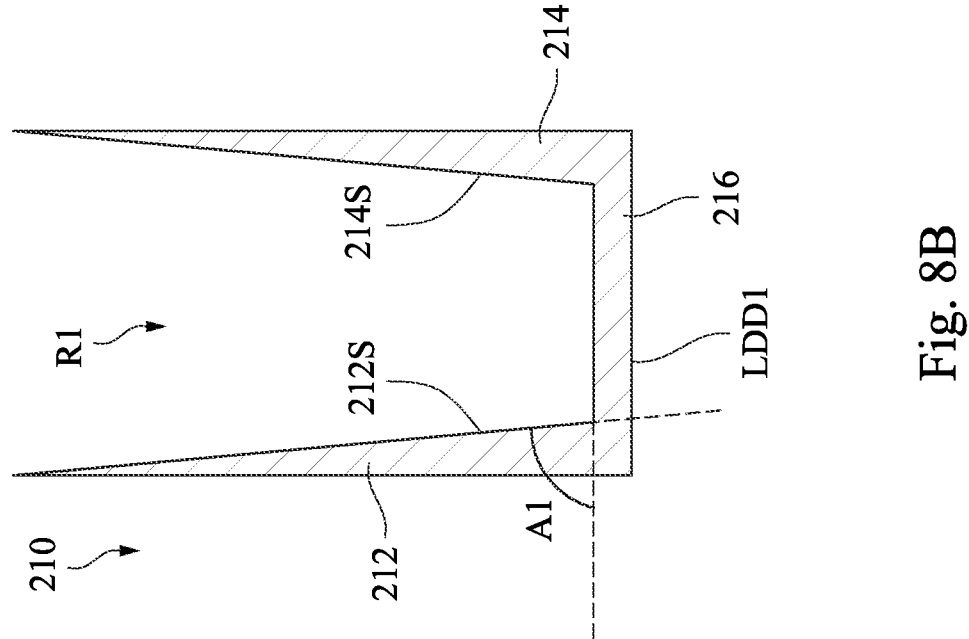
Fig. 8B
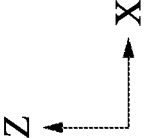

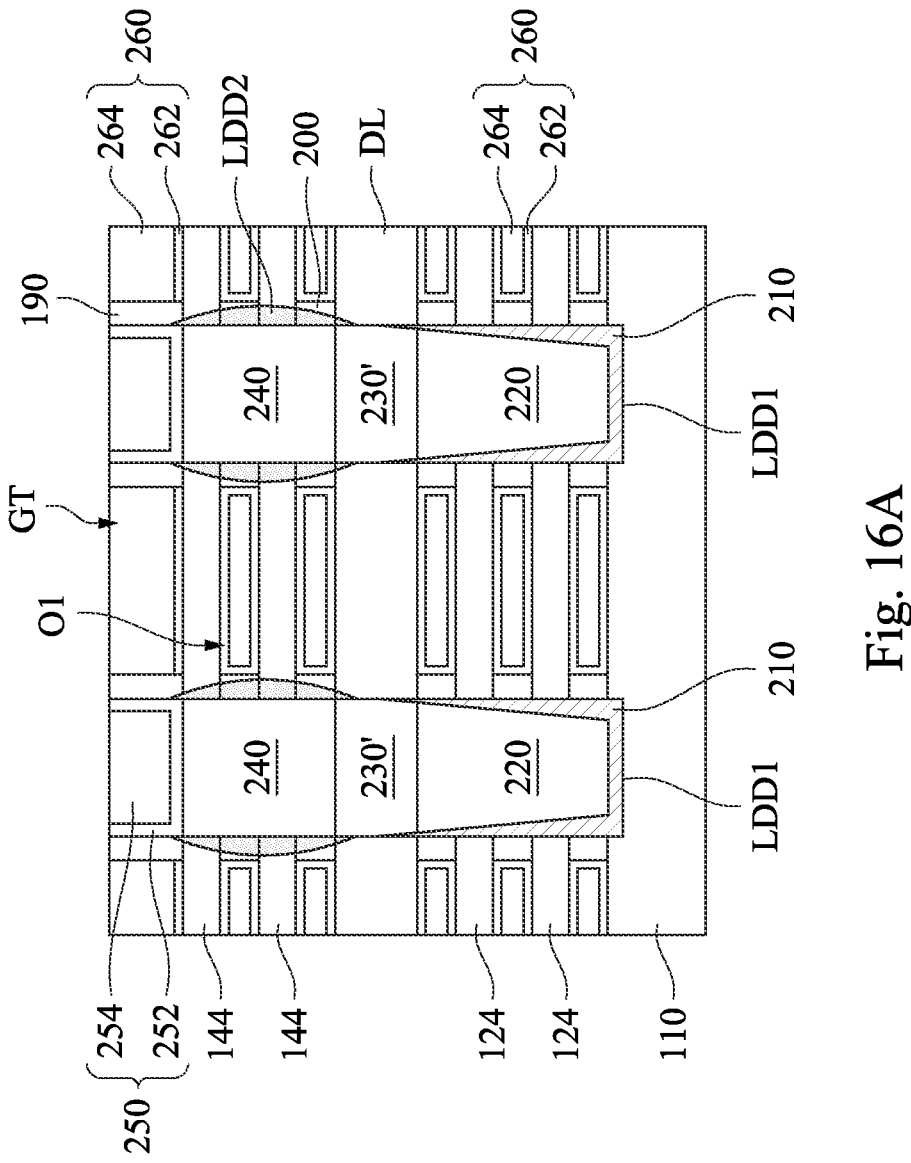
Fig. 16A
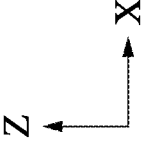

GT

264 ⎤
262 ⎦ 260

262

150

144
144
DL
124
124
112
110

O1

Y

Z

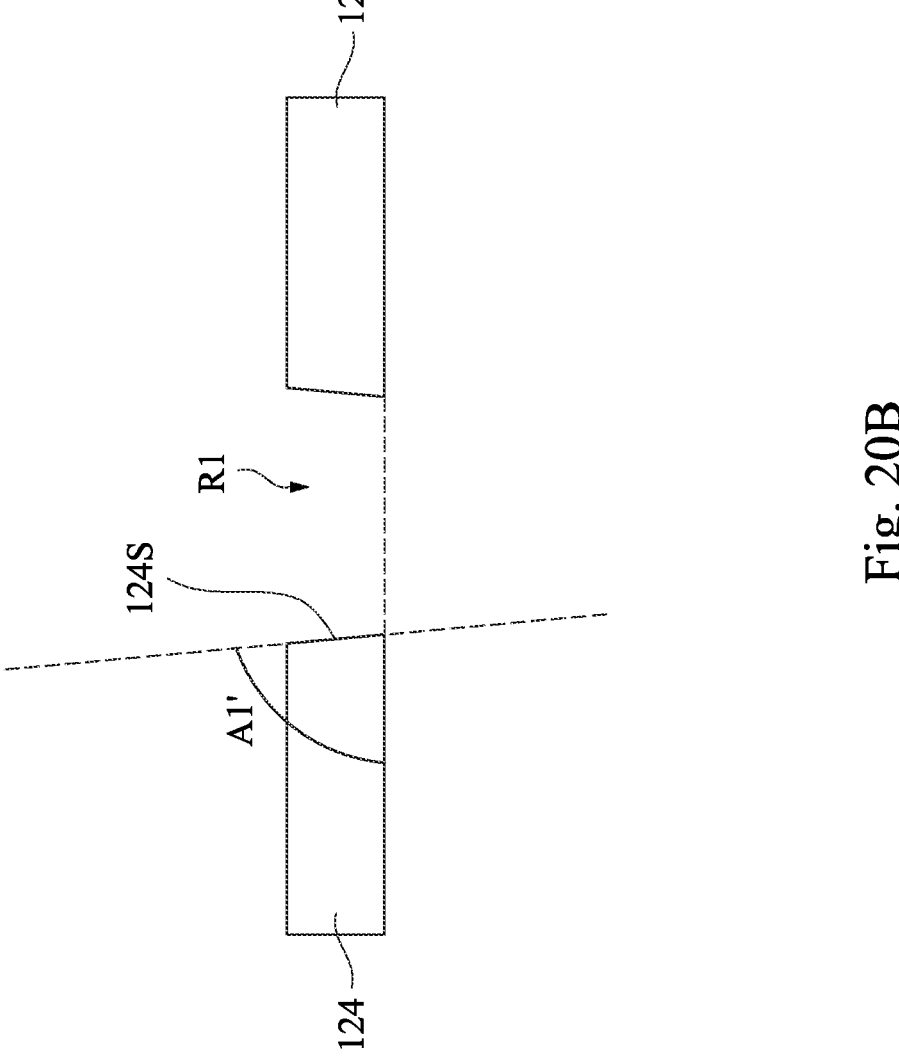
Fig. 20B
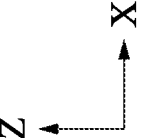

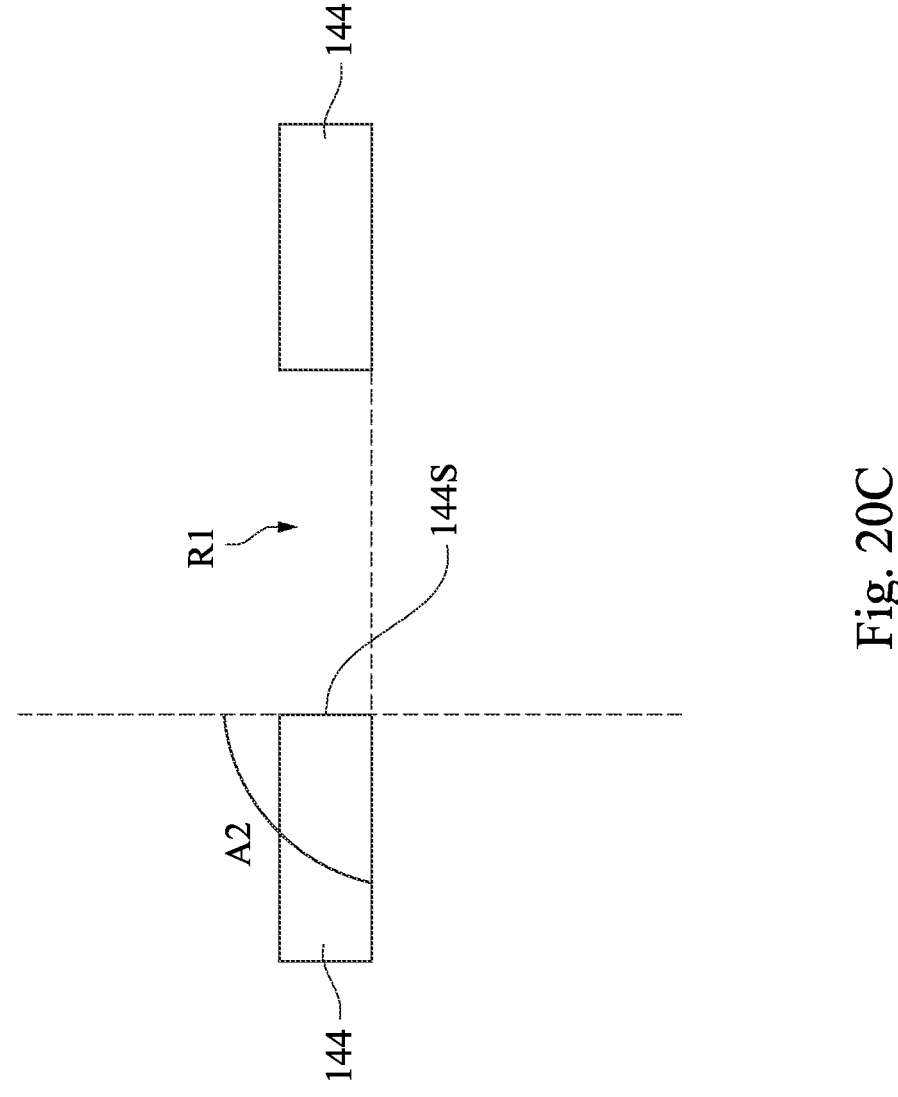
Fig. 20C
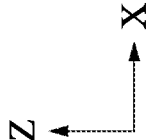

INTEGRATED CIRCUIT DEVICE AND MANUFACTURING METHOD THEREOF

BACKGROUND

Semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 20A-24 illustrate schematic cross-sectional views of intermediate stages in the manufacture of an integrated circuit device in accordance with some embodiments of the present disclosure.

DETAILED DESCRIPTION

Figure 1:
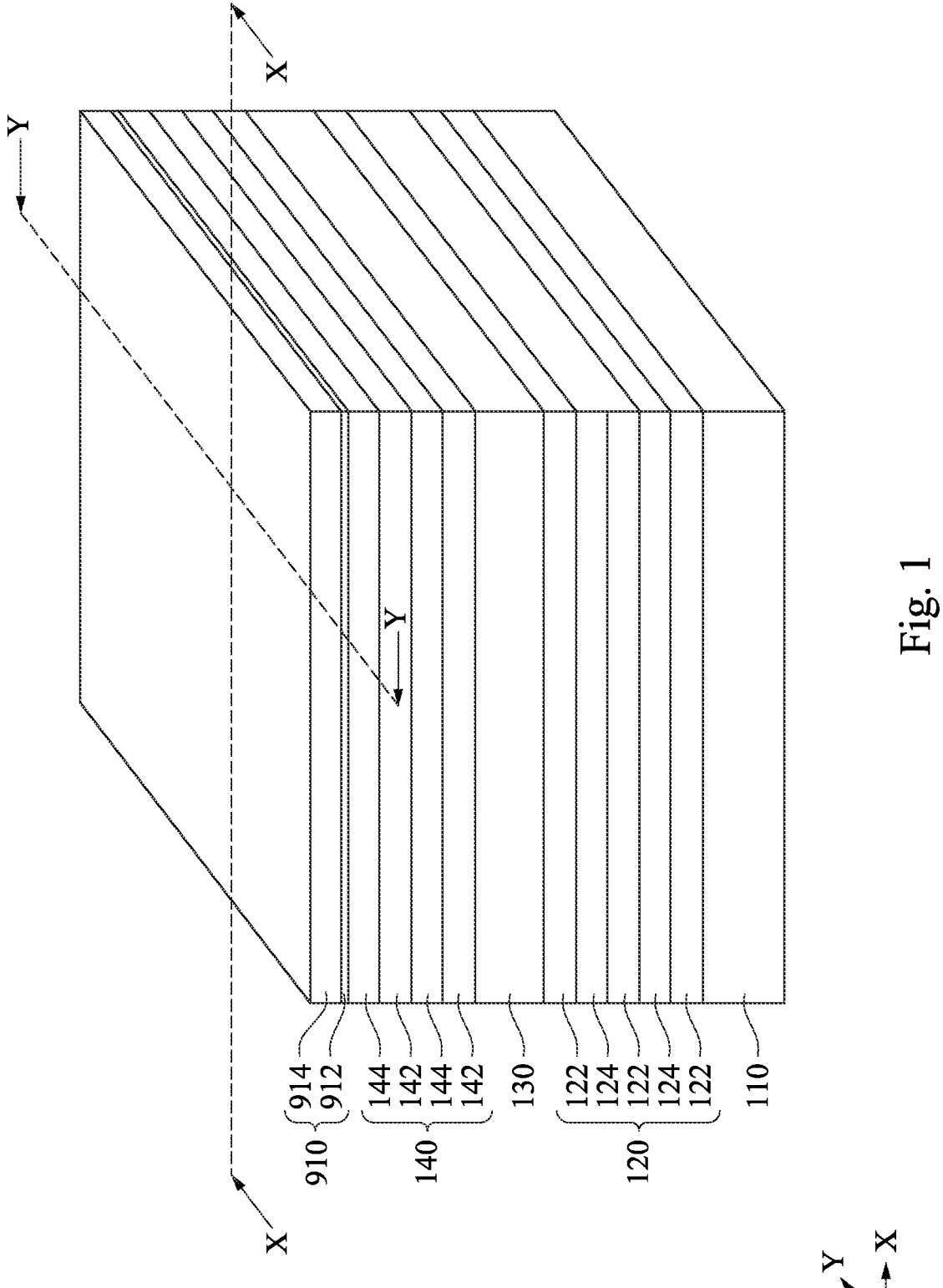
FIGS. 1-18 illustrate schematic cross-sectional views of intermediate stages in the manufacture of an integrated circuit device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" may mean within 20 percent, or within 10 percent, or within 5 percent of a given value or range. One skilled in the art will realize, however, that the value or range recited throughout the description are merely examples, and may be reduced with the down-scaling of the integrated circuits. Numerical quantities given herein are approximate, meaning that the term "around," "about," "approximately," or "substantially" can be inferred if not expressly stated.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The term "multi-gate device" is used to describe a device (e.g., a semiconductor transistor) that has at least some gate material disposed on multiple sides of at least one channel of the device. In some examples, the multi-gate device may be referred to as a gate all around (GAA) device or a nanosheet device having gate material disposed on at least four sides of at least one channel of the device. The channel region may be referred to as a "nanowire," which as used herein includes channel regions of various geometries (e.g., cylindrical, bar-shaped) and various dimensions. In some examples, the multi-gate device may be referred to as a FinFET device. However, one of ordinary skill would recognize that the teaching can apply to a single channel (e.g., single nanosheet) or any number of channels. One of ordinary skill may recognize other examples of semiconductor devices that may benefit from aspects of the present disclosure.

FIGS. 1-18 illustrate schematic cross-sectional views of intermediate stages in the manufacture of an integrated circuit device in accordance with some embodiments of the present disclosure. FIGS. 2, 3, 4B, 15B, and 16B are cross-sectional views of the integrated circuit device (e.g., taken along line Y-Y in FIG. 1) at various manufacturing stages in accordance with some embodiments. FIGS. 4A, 5-7A, 8A, 9A, 10-15A, 16A, 17 and 18 are cross-sectional views of the integrated circuit device (e.g., taken along line X-X in FIG. 1) at various manufacturing stages in accordance with some embodiments. It is understood that additional steps may be provided before, during, and after the steps shown in FIGS. 1-18, and some of the steps described below can be replaced or eliminated for additional embodiments of the method. The order of the operations/processes may be interchangeable.

Reference is made to FIG. 1. A stack ES including an epitaxial stack 120, a middle layer 130, and an epitaxial stack 140 are formed over a substrate 110 in a sequence. In some embodiments, the substrate 110 may include silicon (Si). Alternatively, the substrate 110 may include germanium (Ge), silicon germanium (SiGe), a III-V material (e.g., GaAs, GaP, GaAsP, AlInAs, AlGaAs, GaInAs, InAs, GaInP, InP, InSb, and/or GaInAsP; or a combination thereof) or other appropriate semiconductor materials. In some embodiments, the substrate 110 may include a semiconductor-on-insulator (SOI) structure such as a buried dielectric layer. Also, the substrate 110 may include a buried dielectric layer such as a buried oxide (BOX) layer, such as that formed by a method referred to as separation by implantation of oxygen (SIMOX) technology, wafer bonding, selective epitaxial growth (SEG), or another appropriate method.

The epitaxial stack 120 includes sacrificial layers 122 and channel layers 124 alternately arranged over the substrate 110. The sacrificial layers 122 may have different semiconductor compositions from the channel layers 124. In some embodiments, the semiconductor layer 122 are $Si_yGe_{1-y}$, and the channel layers 124 are $Si_xGe_{1-x}$, in which x and y are in a range from 0 to 1, and x>y. However, other embodiments are possible including those that provide for the material/compositions having different oxidation rates and/or etch selectivity. In some embodiments, the sacrificial layers 122 include SiGe and the channel layers 124 include Si. In some alternative embodiments, the sacrificial layers 122 include Si and the channel layers 124 include SiGe.

By way of example, epitaxial growth of the layers of the stack 120 may be performed by a molecular beam epitaxy (MBE) process, a metalorganic chemical vapor deposition (MOCVD) process, and/or other suitable epitaxial growth processes. In some embodiments, the epitaxially grown layers such as, the sacrificial layer 122 and the channel layers 124 include suitable semiconductor material, such as Si, Ge, Sn, SiGe, GeSn, III-V semiconductor, the like, or the combination thereof. In some embodiments, the channel layers 124 may include a same semiconductor material as that of the substrate 110. In some embodiments, the epitaxially grown sacrificial layers 122 include a different material than the substrate 110. In some other embodiments, at least one of the sacrificial layer 122 and the channel layers 124 may include other materials such as a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. As discussed, the materials of the sacrificial layer 122 and the channel layers 124 may be chosen based on providing differing oxidation and/or etching selectivity properties. In some embodiments, the sacrificial layer 122 and the channel layers 124 are intrinsic semiconductor layers, which are not intentionally doped, for example, not having intentionally placed dopants, but rather having a doping resulting from process contaminants. In some embodiments, the sacrificial layer 122 and the channel layers 124 are substantially dopant-free (i.e., having an extrinsic dopant concentration from about 0 cm$^{-3}$ to about $1 \times 10^{18}$ cm$^{-3}$), where for example, no intentional doping is performed during the epitaxial growth process.

A middle layer 130 is deposited over the stack 120 for spacing the top channel layer in the stack 140 and the bottom channel layers in the stack 120 from each other. The middle layer 130 may include a material different from that of the sacrificial layer 122 and the channel layers 124. In some embodiments, the middle layer 130 may include a semiconductor material, such as SiGe, Ge, or other suitable semiconductor materials with a semiconductor composition different from that of the sacrificial layer 122 and the channel layers 124, in which the middle layer 130 can be replaced with a dielectric material in subsequent process. For example, the semiconductor layer 122 are $Si_yGe_{1-y}$, and the channel layers 124 are $Si_xGe_{1-x}$, the middle layer 130 are $Si_zGe_{1-z}$, in which x, y, and z are in a range from 0 to 1, and x>y>z. In some alternative embodiments, the middle layer 130 may include a dielectric material, such as silicon nitride, silicon oxide, silicon oxynitride, the like, or the combination thereof.

The epitaxial stack 140 includes sacrificial layers 142 and channel layers 144 alternately arranged over the middle layer 130. The sacrificial layers 142 may have different semiconductor compositions from the channel layers 144. In some embodiments, the semiconductor layer 142 are $Si_yGe_{1-y}$, and the channel layers 144 are $Si_xGe_{1-x}$, in which x and y are in a range from 0 to 1, and x>y. For example, x is 1, and y is in a range from about 0.2 to about 0.95. However, other embodiments are possible including those that provide for the material/compositions having different oxidation rates and/or etch selectivity. In some embodiments, the sacrificial layers 142 include SiGe and the channel layers 144 include Si. In some alternative embodiments, the sacrificial layers 142 include Si and the channel layers 144 include SiGe. Other details of the epitaxial stack 120, the sacrificial layers 122, and channel layers 124 are similar to the epitaxial stack 140, the sacrificial layers 142, and channel layers 144, and not repeated herein.

The channel layers 124 and 144 or portions thereof may form nanosheet channel(s) of the multi-gate transistor. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. In some embodiments, a space between adjacent channel layers 124/144 may be in a range from about 2 nanometers to about 30 nanometers. In the present embodiments, the multiple channel layers 124/144 are used. In some alternative embodiments, a single channel layer 124/144 can be used. The use of the channel layers 124 and 144 to define a channel or channels of a device is further discussed below. The channel layers 124 and 144 may be referred to as semiconductor channels in the context.

Figure 2:
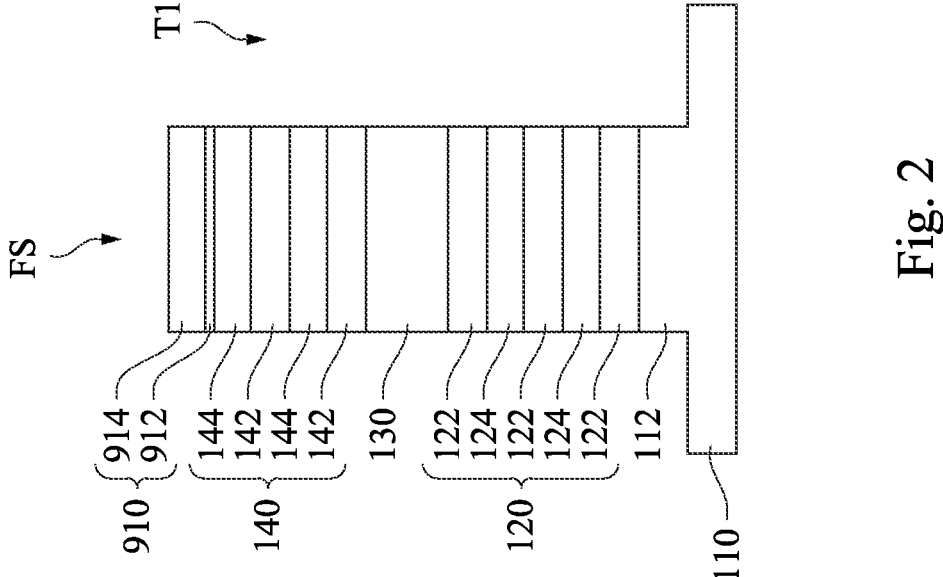
Figure 2:
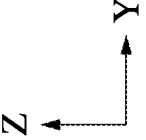

Reference is made to FIG. 2. One or more semiconductor fins FS extending from the substrate 110 are formed. The semiconductor fin FS may extend substantially along a direction X. In various embodiments, each of the fins FS includes a substrate portion 112 formed from the substrate 110, portions of each of the epitaxial layers 122 and 124 of the epitaxial stack 120, a portion of the middle layer 130, and portions of each of the epitaxial layers 142 and 144 of the epitaxial stack 140. The fins FS may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins FS by etching initial epitaxial stack 120, the middle layer 130, and the epitaxial stack 140. The etching process can include dry etching, wet etching, reactive ion etching (RIE), and/or other suitable processes.

In the embodiments as illustrated in FIGS. 1 and 2, a hard mask (HM) layer 910 is formed over the epitaxial stack 140 prior to patterning the fins FS. In some embodiments, the HM layer 910 includes an oxide layer 912 (e.g., a pad oxide layer that may include SiO₂) and a nitride layer 914 (e.g., a pad nitride layer that may include Si₃N₄) formed over the oxide layer. The oxide layer 912 may act as an adhesion layer between the epitaxial stack 120 and the nitride layer 914 and may act as an etch stop layer for etching the nitride layer 914. In some examples, the HM oxide layer 912 includes thermally grown oxide, chemical vapor deposition (CVD)-deposited oxide, and/or atomic layer deposition (ALD)-deposited oxide. In some embodiments, the HM nitride layer 914 is deposited on the HM oxide layer 912 by CVD and/or other suitable techniques.

The fins FS may subsequently be fabricated using suitable processes including photolithography and etch processes. The photolithography process may include forming a photoresist layer (not shown) over the HM layer 130, exposing the photoresist to a pattern, performing post-exposure bake processes, and developing the resist to form a patterned mask including the resist. In some embodiments, patterning the resist to form the patterned mask element may be performed using an electron beam (e-beam) lithography process or an extreme ultraviolet (EUV) lithography process. The patterned mask may then be used to protect regions of the substrate 110, and layers formed thereupon, while an etch process forms trenches T1 in unprotected regions through the HM layer 910, through the epitaxial stack 140, the middle layer 130, the epitaxial stack 140, and into the substrate 110, thereby leaving the plurality of extending fins FS. The trenches T1 may be etched using a dry etch (e.g., reactive ion etching), a wet etch, and/or combination thereof. Numerous other embodiments of methods to form the fins on the substrate may also be used including, for example, defining the fin region (e.g., by mask or isolation regions) and epitaxially growing the epitaxial stack 120, the middle layer 130, and the epitaxial stack 140 in the form of the fins FS.

Figure 3:
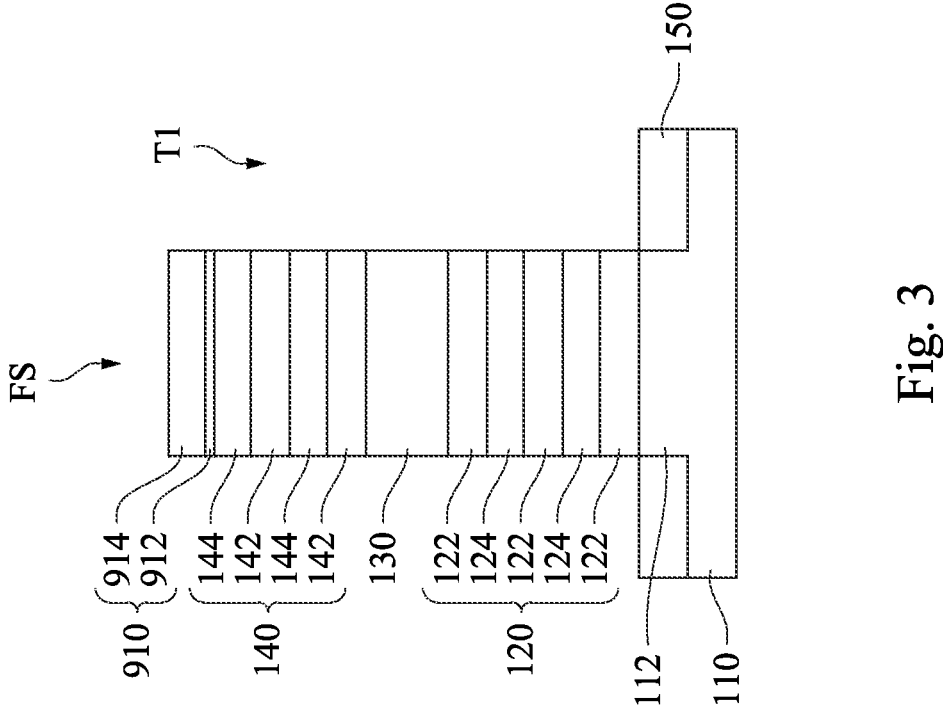
Figure 3:
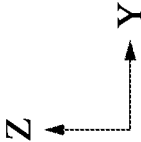

Reference is made to FIG. 3. An isolation structure 150 is formed in the trench T1 between the fins FS. The isolation structure 150 may be a single-layer or a multi-layer structure. In some embodiments, the isolation structure 150 includes low-k dielectric materials, SiN, SiCN, SiOC, SiOCN or the like. Formation of the isolation structure 150 may include depositing a dielectric material over the structure in FIG. 2, followed by an etching back process. Through the etching back process, a top surface of the isolation structure 150 may be level with or lower than a top surface of the substrate portion 112. In some alternatively embodiments, the top surface of the isolation structure 150 may be higher than the top surface of the substrate portion 112.

Figure 4A:
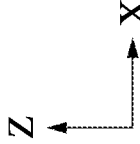
Figure 4B:
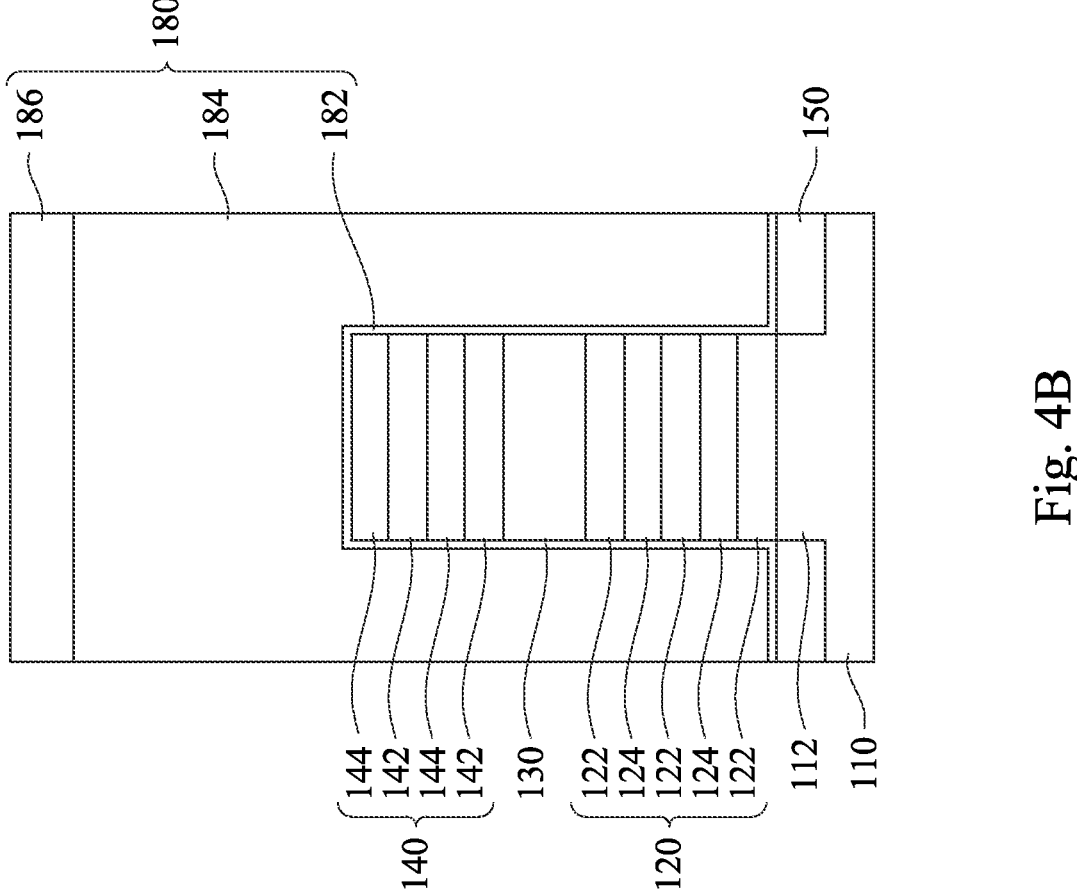
Figure 4B:
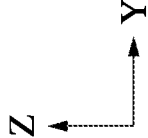

Reference is made to FIGS. 4A and 4B. The HM layer 910 is removed, and one or more dummy gate structures 180 are formed on the epitaxial stack 140. The removal of the HM layer 910 may be performed by any suitable process, such as dry etch, wet etch, or a combination thereof. The removal of the HM layer 910 exposes the top surfaces of the topmost epitaxial layer 144 in the epitaxial stack 140. The dummy gate structure 180 may include a gate dielectric 182, a gate electrode 184, and a hard mask 186. The gate dielectric 182 may include one or more layers of dielectric material, such as silicon oxide, silicon nitride, a high-k dielectric material, and/or other suitable dielectric material. In some embodiments, the gate electrode 184 includes a material different than that of the gate dielectric 182. In some embodiments, the gate dielectric 182 may be deposited by a CVD process, a sub-atmospheric CVD (SACVD) process, a FCVD process, an ALD process, a PVD process, or other suitable process. The gate electrode 184 may include polycrystalline silicon (polysilicon). The hard mask 186 may include a silicon oxide layer and a silicon nitride layer. In some embodiments, the materials of the dummy gate structure 180 are formed by various processes such as layer deposition, for example, CVD, PVD, ALD, thermal oxidation, or other suitable deposition techniques, or combinations thereof.

The dummy gate structures 180 may be formed by first depositing a blanket gate dielectric layer, a gate electrode layer, and a mask layer, followed by pattern and etch processes. For example, the pattern process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etch (e.g., RIE), wet etch, other etch methods, and/or combinations thereof. By patterning the dielectric layer, the gate electrode layer, and the mask layer, the fins FS are partially exposed on opposite sides of the dummy gate structure 180.

Gate spacers 190 are formed on opposite sidewalls of the dummy gate structures 180. In some embodiments, the spacer 190 includes a single layer or multiple layers. The spacer 190 may be made of a dielectric material such as silicon oxide, silicon nitride, silicon carbide, silicon oxynitride, SiCN, silicon oxycarbide, SiOCN, and/or combinations thereof. The gate spacers 190 may be formed by first depositing one or more conformal spacer material layers and subsequently etching back the one or more spacer material layers to form gate spacers 190. The one or more conformal spacer material layers may be formed by ALD or CVD processes. The etching back process may include an anisotropic dry etch process. During the anisotropic dry etch process, most of the one or more spacer material layers are removed from horizontal surfaces, such as the tops of the fins FS, leaving the gate spacers 190 on the vertical surfaces, such as the sidewalls of the dummy gate structures 180.

Figure 5:
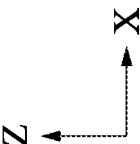

Reference is made to FIG. 5. Exposed portions of the semiconductor fins FS that extend laterally beyond the gate spacers 190 (e.g., in source/drain regions of the fins FS) are etched by using, for example, an anisotropic etching process that uses the dummy gate structures 180 and the gate spacers 190 as an etch mask, resulting in recesses R1 into the semiconductor fins FS and between corresponding dummy gate structures 180. The recesses R1 may extend through the epitaxial layers 122, 124, 142, and 144 and the middle layer 130. A depth of the recess R1 may be in a range from about 30 nanometers to about 150 nanometers. After the anisotropic etching, end surfaces of the epitaxial layers 122, 124, 142, and 144 are exposed and aligned with respective outermost sidewalls of the gate spacers 190, due to the anisotropic etching. In some embodiments, the anisotropic etching may be performed by a dry chemical etch (e.g., reactive-ion etching) with a plasma source and a reaction gas. The plasma source may be an inductively coupled plasma (ICR) source, a transformer coupled plasma (TCP) source, an electron cyclotron resonance (ECR) source or the like, and the reaction gas may be, for example, a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas ($O_2$), the like, or combinations thereof.

Figure 6:
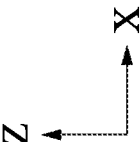

Reference is made to FIG. 6. The sacrificial layers 122 and 142 are laterally or horizontally recessed by using suitable selective etching process, resulting in lateral/side-wall recesses R2 vertically between corresponding channel layers 124, and vertically between corresponding channel layers 144. For example, end surfaces of the sacrificial layers 122 and 142 are recessed by the selective etching process. The various compositions in epitaxial layers result in different oxidation rates and/or etch selectivity, thereby facilitating the selective etching process. In some embodiments, a selective dry etching process is performed by using fluoride-based etchant gas, such as $NF_3$, $SF_6$, the like, or the combination thereof. The fluoride-based gas may etch SiGe at a faster etch rate than it etches Si. The channel layers 124 and 144 may have a higher etch resistance to the selective etching process than that of the sacrificial layers 122 and 142. In some embodiments, the selective etching includes SiGe oxidation followed by a $SiGeO_x$ removal. For example, the oxidation may be provided by an oxygen-containing cleaning process and then $SiGeO_x$ removed by the fluoride-based plasma (e.g., $NF_3$ plasma) that selectively etches $SiGeO_x$ at a faster etch rate than it etches Si. Moreover, because oxidation rate of Si is much lower (sometimes 30 times lower) than oxidation rate of SiGe (or Ge), the channel layers 124 and 144 may not be significantly etched by the process of laterally recessing the sacrificial layers 122 and 142. As a result, the channel layers 124 and 144 laterally extend past opposite end surfaces of the sacrificial layers 122 and 142.

Inner spacers 200 are formed in the recesses R2. Stated differently, the inner spacers 200 may be formed on opposite end surfaces of the laterally recessed sacrificial layers 122 and 142. The inner spacers 200 may include a low-k dielectric material, such as $SiO_x$, SiON, SiOC, SiN, SiCN, or SiOCN. Formation of the inner spacers 200 may include depositing an inner spacer material layer, followed by an anisotropic etching process to trim the deposited inner spacer material layer. Through the anisotropic etching process, only portions of the deposited inner spacer material layer that fill the lateral/sidewall recesses R2 are left. The inner spacers 200 may include a single layer or multiple layers. The inner spacers 200 may serve to isolate metal gates from source/drain regions formed in subsequent processing. In the example of FIG. 6, sidewalls of the inner spacers 200 are aligned with sidewalls of the channel layers 124 and 144.

In some embodiments where the middle layer 130 (refer-ring to FIG. 5) includes semiconductor materials, the middle layer 130 (referring to FIG. 5) may be removed by the process of laterally recessing the sacrificial layers 122 and 142 to leave a space between the epitaxial stacks 120 and 140, and a dielectric layer DL (interchangeably referred to as channel isolation dielectric) may be formed in the space between the epitaxial stacks 120 and 140, for example, during the deposition of the inner spacer material layer that forms the inner spacers 200, or other deposition process. The dielectric layer DL may include a dielectric material, such as silicon nitride, silicon oxide, silicon oxynitride, the like, or the combination thereof.

Figure 7A:
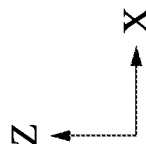

Reference is made to FIG. 7A. Epitaxial layers 210 may be formed in the recesses R1 on opposite sides of the channel layers 124. The epitaxial layers 210 are in contact with the exposed end surfaces of the channel layers 124. In some embodiments, a top end of the epitaxial layers 210 are lower than a top surface of the dielectric layer DL, such that the epitaxial layers 210 are free of contacting the channel layers 144. The epitaxial layers 210 may include suitable semiconductor material, such as Si, Ge, Sn, SiGe, GeSn, III-V semiconductor, the like, or the combination thereof. In some embodiments, the epitaxial layers 210 may include a same semiconductor material as that of the channel layers 124 and the substrate 110. For example, the epitaxial layers 210 are silicon layers.

The epitaxial layers 210 may be formed by performing an epitaxial growth process that provides an epitaxial material on the exposed surfaces of the channel layers 124 and the substrate portion 112. Suitable epitaxial processes include CVD deposition techniques (e.g., vapor-phase epitaxy (VPE) and/or ultra-high vacuum CVD (UHV-CVD)), molecular beam epitaxy, and/or other suitable processes. The epitaxial growth process may use gaseous and/or liquid precursors, which interact with the composition of semicon-ductor materials of the channel layers 124 and the substrate portion 112. In some embodiments, during or after the epitaxial growth process, one or more etching processes may be performed to adjust the profile the profile of the epitaxial layers 210.

Figure 7B:
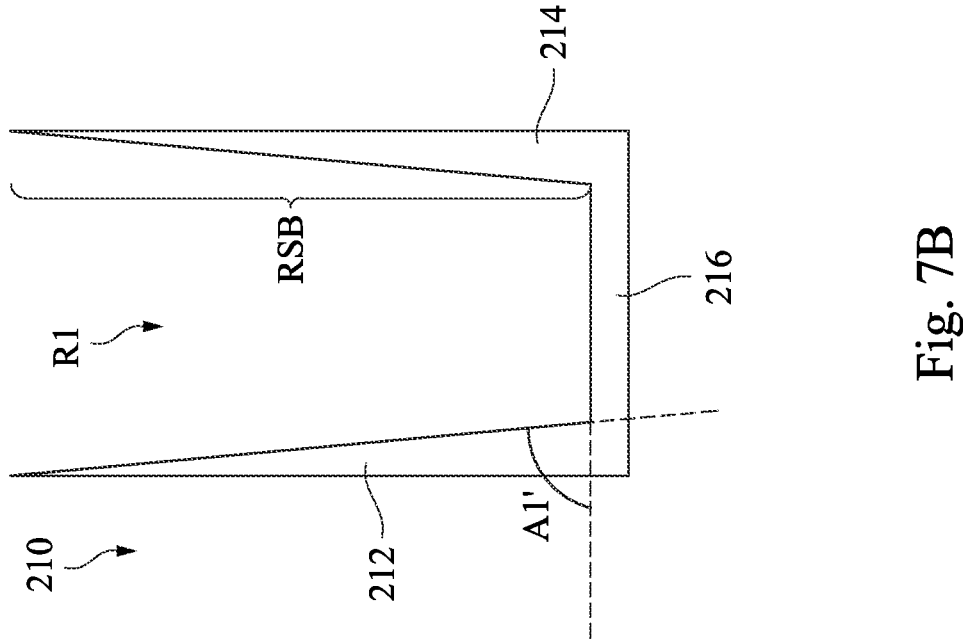

FIG. 7B is an enlarged view of the epitaxial layer 210 in FIG. 7A. The epitaxial layer 210 may have a first side portion 212 adjacent a first portion of the channel layers 124, a second side portion 214 adjacent a second portion of the channel layers 124, and a middle portion 216 connecting the first side portion 212 to the second portion. The first side portion 212 of the epitaxial layer 210 may have a tapered profile with a tapered/slant sidewall 212S opposite to the first portion of the channel layers 124. The second side portion 214 of the epitaxial layer 210 may have a tapered profile with a tapered/slant sidewall 214S opposite to the second portion of the channel layers 124. An angle A1 is between the sidewall 212S/214S and a top surface of the substrate 110 and/or the channel layer 124, which is sub-stantially the plane of the directions X and Y. The angle A1 may be in a range from about 5 degrees to about 60 degrees. In some embodiments, the resulted epitaxial layer 210 may have a concave top surface. Stated differently, a top portion of the recess R1 may have straight sidewalls, and a bottom portion of the recess R1 may taper down.

FIG. 7C is an enlarged view of the channel layer 144 in FIG. 7A. The sidewall 144S of the channel layer 144 may extend substantially along the direction Z, which is a direc-tion normal to wafer surface. The sidewall 144S may be substantially vertical to a top surface of the substrate 110, and may referred to as a substantial vertical sidewall. An angle A2 is between the sidewall 144S of the channel layer 144 and a top surface of the substrate 110, which is sub-stantially the plane of the directions X and Y. The angle A2 is greater than the angle A1. For example, the angle A2 may be in a range from about 80 degrees to about 90 degrees.

Reference is made to FIGS. 7A-7C. With the epitaxial layers 210, the recess R1 has an upper sidewall RSU adjacent the epitaxial stack 140 and a lower sidewall RSB adjacent the epitaxial stack 120. An angle A2 between the upper sidewall RSU and a top surface of the substrate 110 and/or the channel layer 144 is greater than an angle A1 between the lower sidewall RSB and the top surface of the substrate 110.

Figure 8A:
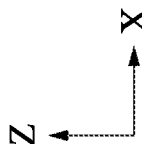

Reference is made to FIG. 8A. An ion implantation process P1 is performed to dope the epitaxial layers 210 to form first-type lightly doped regions LDD1. The ion implan-tation process P1 may be performed by introducing doping species with a first conductive type. For example, the doping species may include: p-type dopants, such as boron, $BF_2$, gallium; n-type dopants, such as phosphorus, arsenic; other suitable dopants, such as carbon, germanium; and/or the combinations thereof. The ion implantation process P1 may be performed with a dosage ranging from about 5E13 atoms/cm$^2$ to about 1E16 atoms/cm$^2$ and an energy ranging from about 1 keV to about 50 keV at a temperature ranging from −100 Celsius degrees to about 500 Celsius degrees. A depth of the damage layer by the ion implantation process P1 may be in a range from about 1 nanometer to about 15 nanometers. An annealing process may be performed to activate the damage layer, thereby forming the lightly doped regions LDD1. A dopant concentration of the lightly doped regions LDD1 may be in a range from about 1E20 to about 1E21 atoms/cm$^3$. An angle between the wafer surface normal and the ion beam is the tilt angle. In some embodiments of the present disclosure, the ion implantation process P1 is performed with a tilt angle ranging from about 0 degree to about 5 degrees. Stated differently, the doping species are almost normally incident into the epitaxial layers 210.

Reference is made to FIGS. 8A and 8B. FIG. 8B is an enlarged view of the epitaxial layer 210 in FIG. 8A. With the slant sidewalls 212S and 214S of the portions 212 and 214 of the epitaxial layers 210, the doping species in the ion implantation process P1 can be received by the portions 212 and 214 of the epitaxial layers 210. As a result, the lightly doped regions LDD1 can be formed adjacent to the first and second portions of the channel layers 124. According to the profile of the epitaxial layers 210, the lightly doped regions LDD1 may include slant/tapered sidewalls (e.g., the slant sidewalls 212S and 214S). As aforementioned, the slant/tapered sidewalls of the lightly doped regions LDD1 has the angle A1 with respect to the top surface of the substrate 110 (e.g., XY plane).

Figure 9A:
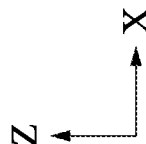

Reference is made to FIG. 9A. An ion implantation process P2 is performed to dope the end portions of the channel layers 144 to form second-type lightly doped regions LDD2. The ion implantation process P2 may be performed by introducing doping species with a second conductive type opposite to the first conductive type of the doping species in the ion implantation process P1 (referring to FIG. 8A). For example, the doping species may include: p-type dopants, such as boron, $BF_2$, gallium; n-type dopants, such as phosphorus, arsenic; other suitable dopants, such as carbon, germanium; and/or the combinations thereof. The ion implantation process P2 may be performed with a dosage ranging from about 5E13 atoms/cm$^2$ to about 1E16 atoms/cm$^2$ and an energy ranging from about 1 keV to about 50 keV at a temperature ranging from −100 Celsius degrees to about 500 Celsius degrees. A depth of the damage layer by the ion implantation process P2 may be in a range from about 1 nanometer to about 15 nanometers. An annealing process may be performed to activate the damage layer, thereby forming the lightly doped regions LDD2. A dopant concentration of the lightly doped regions LDD2 may be in a range from about 1E20 to about 1E21 atoms/cm$^3$. In some embodiments, after the ion implantation process P1 and P2, an annealing process may be performed to activate the damage layers resulted from the ion implantation process P1 and P2, thereby forming the lightly doped regions LDD1 and LDD2.

Figure 9B:
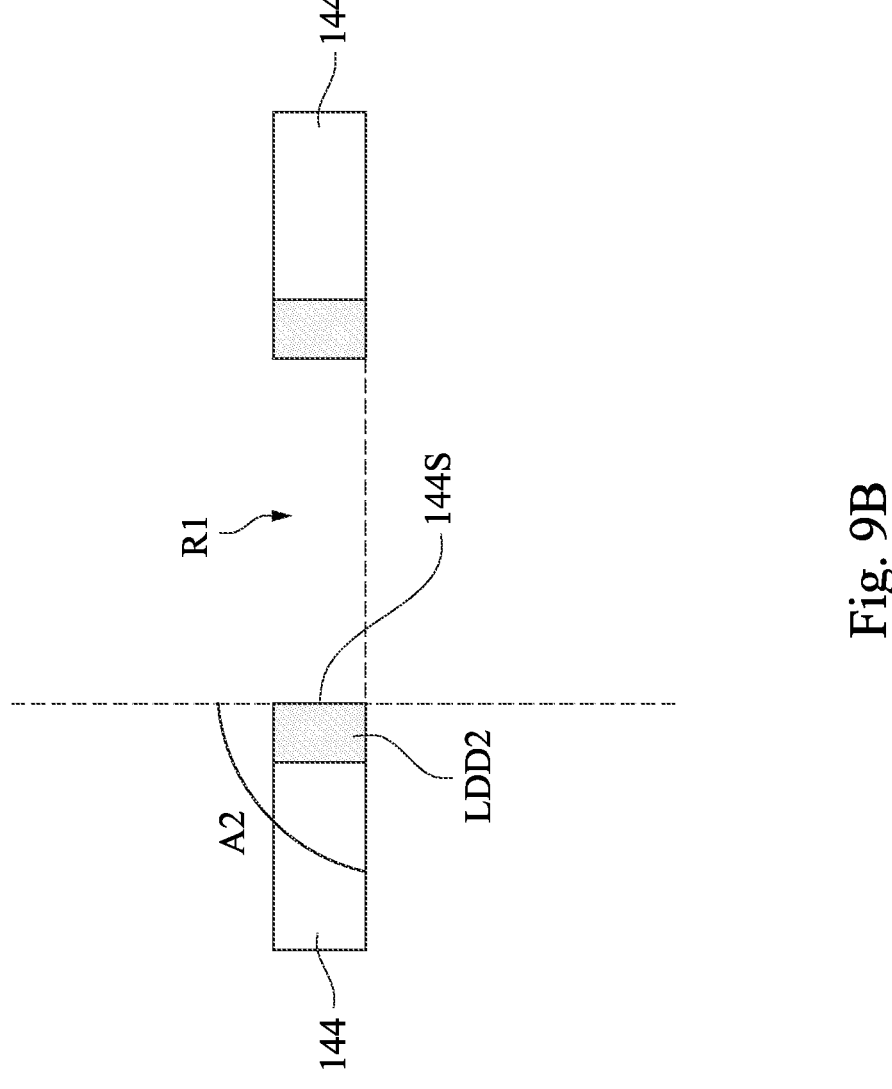

In some embodiments of the present disclosure, the ion implantation process P2 is performed with a tilt angle greater than a tilt angle of the ion implantation process P1. For example, the tilt angle of the ion implantation process P2 may range from about 40 degree to about 80 degrees, such as from about 50 degree to about 70 degrees. FIG. 9B is an enlarged view of the channel layer 144 in FIG. 9A. By the high tilt angle, the lightly doped regions LDD2 can be formed in the end portions of the channel layers 144. In some further embodiments, referring back to FIG. 9A, the ion implantation process P2 may be performed such that the doping species are implanted into the inner spacers 200 on end surfaces of the sacrificial layers 142. In some further embodiments, the ion implantation process P2 may be performed such that the doping species are implanted into a top portion of the dielectric layer DL. In some embodiments, the ion implantation process P1 may be referred to as a normal-incident ion implantation process, and the ion implantation process P2 may be a high-tilt ion implantation process. In some embodiments, the ion implantation processes P1 and P2 are performed such that a bottom of the lightly doped regions LDD1 is spaced apart from a top end of the lightly doped regions LDD1.

According to the profile of the channel layers 144, the lightly doped regions LDD2 may include vertical sidewalls (e.g., the sidewalls 144S). As aforementioned, the vertical sidewalls of the lightly doped regions LDD2 has the angle A2 with respect to the top surface of the substrate 110 (e.g., XY plane).

In a complementary FET (CFET) architecture, nMOS and pMOS devices are stacked on top of each other. In some embodiments, the first-type lightly doped regions LDD1 are p-type lightly doped regions, and the second-type lightly doped regions LDD2 are n-type lightly doped regions. In some alternative embodiments, the first-type lightly doped regions LDD1 are n-type lightly doped regions, and the second-type lightly doped regions LDD2 are p-type lightly doped regions.

Figure 10:
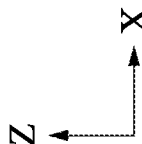

Reference is made to FIG. 10. Source/drain epitaxial structures 220 are formed in the recesses R1 and over the lightly doped regions LDD1. In some embodiments, the slant/tapered sidewalls of the lightly doped regions LDD1 (e.g., the slant sidewalls 212S and 214S) adjoin the source/drain epitaxial structures 220. The source/drain epitaxial structures 220 are doped to have the first conductive type same as that of the lightly doped regions LDD1. In some embodiments, the source/drain epitaxial structures 220 may include Ge, Si, GaAs, AlGaAs, SiGe, GaAsP, SiP, or other suitable material. The source/drain epitaxial structures 220 may be in-situ doped during the epitaxial process by introducing doping species including: p-type dopants, such as boron or $BF_2$; n-type dopants, such as phosphorus or arsenic; and/or other suitable dopants including combinations thereof. For example, n-type source/drain epitaxial structures may be SiP, SiAs, a combination of SiP and SiAs/SiSb, SiSb, or a combination of SiP. SiAs, and SiSb. For example, p-type source/drain epitaxial structures may be SiB, SiGe, SiGe:B. SiSb, or SiGe:Ga. If the source/drain epitaxial structures 220 are not in-situ doped, an implantation process (i.e., a junction implant process) is performed to dope the source/drain epitaxial structures 220. In some embodiments, a dopant concentration of the source/drain epitaxial structures 220 is greater than the dopant concentration of the lightly doped regions LDD1. For example, the dopant concentration of the source/drain epitaxial structures 220 may be in a range from about 1E21 to about 1E22 atoms/cm$^3$.

The source/drain epitaxial structures 220 may be formed by performing an epitaxial growth process that provides an epitaxial material on the surfaces of the epitaxial layers 210. Suitable epitaxial processes include CVD deposition techniques, molecular beam epitaxy, and/or other suitable processes. The epitaxial growth process may use gaseous and/or liquid precursors, which interact with the composition of semiconductor materials of the epitaxial layers 210.

In some embodiments, the epitaxial growth process may also provide an epitaxial material on the exposed surfaces of the channel layer 144. In some embodiments, one or more etching processes may be performed to lower top surfaces of the source/drain epitaxial structures 220. The resulted source/drain epitaxial structures 220 have a top surface lower than that of the channel layer 144. The etching process may be dry etch, wet etch, or the combination thereof.

Figure 11:
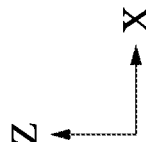

Reference is made to FIG. 11. Blocking or insulating materials 230 are formed into the recesses R1. The blocking materials 230 may include suitable dielectric materials, such as silicon nitride, silicon oxide, silicon carbonitride, silicon oxynitride, and/or other suitable materials. The blocking materials 230 may be deposited by a CVD process or other suitable deposition technique.

Figure 12:
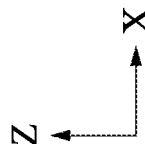

Reference is made to FIG. 12. The blocking materials 230 (referring to FIG. 12) are recessed to expose surfaces of the channel layer 144 and the lightly doped regions LDD2. The recessing process may include suitable etching process (e.g., dry etch). In some embodiments, prior to the recessing process, a plasma treatment may be performed to a bottom portion of the blocking materials 230 (referring to FIG. 12), such that the treated bottom portion of the blocking materials 230 (referring to FIG. 12) may have a higher etch resistance than a top portion of the blocking materials 230 (referring to FIG. 12) during the recessing process. After the recessing process, the treated bottom portions of the blocking materials 230 (referring to FIG. 12) may remain, and referred to as blocking or insulating features 230'.

Figure 13:
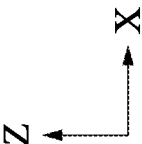

Reference is made to FIG. 13. Source/drain epitaxial structures 240 are formed in the recesses R1 on opposite sides of the channel layers 144 and adjoining the lightly doped regions LDD1. The source/drain epitaxial structures 240 are doped to have the second conductive type same as that of the lightly doped regions LDD2. The source/drain epitaxial structures 240 may be in contact with the exposed end surfaces of the channel layers 144. In some embodiments, the source/drain epitaxial structures 240 may include Ge, Si, GaAs, AlGaAs, SiGe, GaAsP. SiP, or other suitable material. The source/drain epitaxial structures 240 may be in-situ doped during the epitaxial process by introducing doping species including: p-type dopants, such as boron or BF₂; n-type dopants, such as phosphorus or arsenic; and/or other suitable dopants including combinations thereof. For example, n-type source/drain epitaxial structures may be SiP. SiAs, a combination of SiP and SiAs/SiSb, SiSb, or a combination of SiP, SiAs, and SiSb. For example, p-type source/drain epitaxial structures may be SiB, SiGe, SiGe:B. SiSb, or SiGe:Ga. If the source/drain epitaxial structures 240 are not in-situ doped, an implantation process (i.e., a junction implant process) is performed to dope the source/drain epitaxial structures 240. In some embodiments, a dopant concentration of the source/drain epitaxial structures 240 is greater than the dopant concentration of the lightly doped regions LDD2. For example, the dopant concentration of the source/drain epitaxial structures 240 may be in a range from about 1E21 to about 1E22 atoms/cm³.

The source/drain epitaxial structures 240 may be formed by performing an epitaxial growth process that provides an epitaxial material on the exposed surfaces of the channel layers 144. Suitable epitaxial processes include CVD deposition techniques, molecular beam epitaxy, and/or other suitable processes. The epitaxial growth process may use gaseous and/or liquid precursors, which interact with the composition of semiconductor materials of the channel layers 144.

Figure 14:
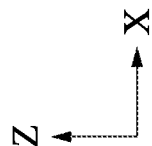

Reference is made to FIG. 14. Dielectric material 250 are formed over the substrate 110 and filling the space between the dummy gate structures 180. In some embodiments, the dielectric material 250 includes a contact etch stop layer (CESL) 252 and an interlayer dielectric (ILD) layer 254 formed in sequence. In some examples, the CESL layer 252 includes a silicon nitride layer, silicon oxide layer, a silicon oxynitride layer, and/or other suitable materials having a different etch selectivity than the ILD layer 254. The CESL layer 252 may be formed by plasma-enhanced chemical vapor deposition (PECVD) process and/or other suitable deposition or oxidation processes. The ILD layer 254 is then deposited over the CESL layer 252. In some embodiments, the ILD layer 254 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the CESL layer 252. The ILD layer 254 may be deposited by a CVD process or other suitable deposition technique. In some embodiments, after formation of the ILD layer 254, the semiconductor device may be subject to a high thermal budget process to anneal the ILD layer 254. After depositing the ILD layer 254, a planarization process may be performed to remove excessive materials of the ILD layer 254. For example, a planarization process includes a chemical mechanical polish (CMP) process which removes portions of the ILD layer 254 and the CESL layer 252 overlying the dummy gate structures 180 and planarizes a top surface of the integrated circuit device. The planarization process may also remove the hard mask 186 (referring to FIG. 13), which leaves the dummy gate electrode 184 exposed.

Figure 15A:
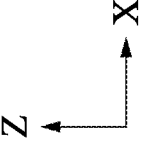
Figure 15B:
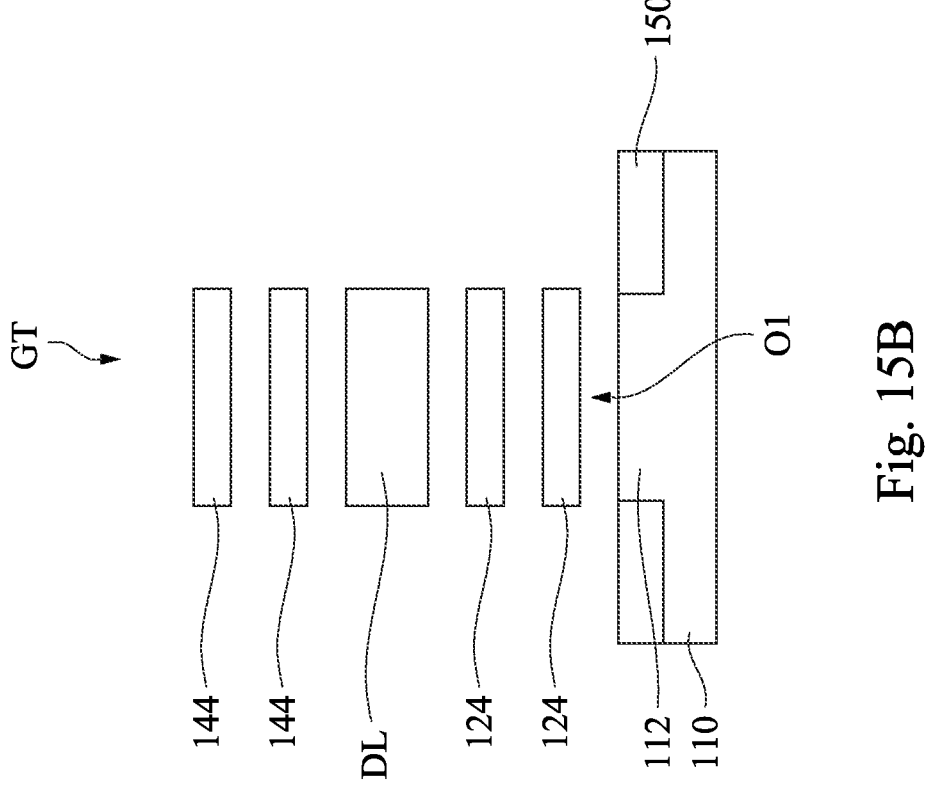
Figure 15B:
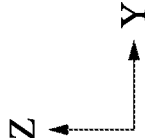

Reference is made to FIGS. 15A-16B. The dummy gate structure 180 and the sacrificial layer 122 and 142 (referring to FIG. 14) are replaced with a high-k/metal gate structure 260. In FIGS. 15A and 15B, the dummy gate structures 180 (referring to FIG. 14) are removed, followed by removing the sacrificial layers 122 and 142 (referring to FIG. 14). In the illustrated embodiments, the dummy gate structures 180 (referring to FIG. 14) are removed by using a selective etching process (e.g., selective dry etching, selective wet etching, or a combination thereof) that etches the dummy gate electrodes 184 (referring to FIG. 14) at a faster etch rate than it etches other materials (e.g., gate spacers 190), thus resulting in gate trenches GT between corresponding gate spacers 190. The gate dielectrics 182 may be removed by suitable etching and/or cleaning process. Thus, the sacrificial layers 122 and 142 (referring to FIG. 14) are exposed in the gate trenches GT. Subsequently, the sacrificial layers 122 and 142 (referring to FIG. 14) are etched by using another selective etching process that etches the sacrificial layers 122 and 142 (referring to FIG. 14) at a faster etch rate than it etches the channel layers 124, the dielectric layer DL, and the channel layers 144, thus forming openings/spaces O1 between neighboring layers 124, DL, and 144. The openings/spaces O1 may expose the sidewalls of the inner spacers 200. In this way, the channel layers 124 become nanosheets suspended over the substrate 110 and between the source/drain epitaxial structures 220, and the channel layers 144 become nanosheets suspended over the substrate 110 and between the source/drain epitaxial structures 240. This step is also called a channel release process. At this interim processing step, the openings/spaces O1 surrounding the nanosheets 124 and 144 may be filled with ambient environment conditions (e.g., air, nitrogen, etc). In some embodiments, the nanosheets 124 and 144 can be interchangeably referred to as nanowires, nanoslabs and nanorings, depending on their geometry. For example, in some other embodiments, the channel layers 124 and 144 may be trimmed to have a substantial rounded shape (i.e., cylindrical) due to the selective etching process for completely removing the sacrificial layers 122 and 142 (referring to FIG. 14). In that case, the resultant channel layers 124 and 144 can be called nanowires.

In some embodiments, the sacrificial layers 122 and 142 (referring to FIG. 14) are removed by using a selective dry etching process. In some embodiments, the sacrificial layers 122 and 142 (referring to FIG. 14) are SiGe and the channel layers 124 and 144 are silicon allowing for the selective removal of the sacrificial layers 122 and 142 (referring to FIG. 14). In some embodiments, the selective dry etching may use chloride-based gases, such as $CF_4$, $C_4F_8$, the like, or the combination thereof. In some embodiments, the selective removal includes SiGe oxidation followed by a $SiGeO_x$ removal. For example, the oxidation may be provided by $O_2$ plasma and then $SiGeO_x$ removed by the chloride-based plasma (e.g., $CF_4$/$C_4F_8$ plasma) that selectively etches $SiGeO_x$ at a faster etch rate than it etches Si, and stops on SiGe. The steps of SiGe oxidation and $SiGeO_x$ removal may be repeated until the sacrificial layers 122 and 142 (referring to FIG. 14) are removed. Moreover, because oxidation rate of Si is much lower (sometimes 30 times lower) than oxidation rate of SiGe, the channel layers 124 and 144 and the substrate portion 112 may remain substantially intact during the channel release process.

Figure 16B:
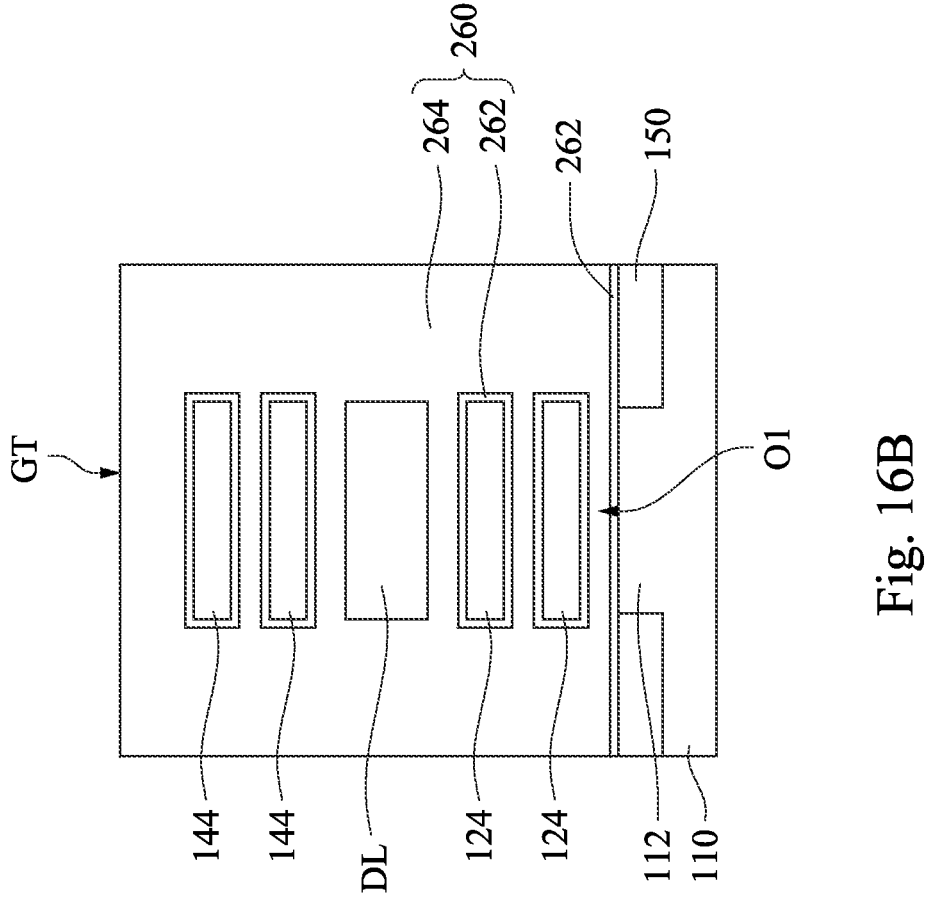
Figure 16B:
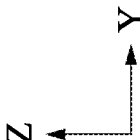

Reference is made to FIGS. 16A and 16B. Replacement gate structures 260 are respectively formed in the gate trenches GT to surround each of the nanosheets 124 and 144 suspended in the gate trenches GT. The gate structures 260 may be final gates of GAA FETs. The final gate structure may be a high-k/metal gate stack, however other compositions are possible. In some embodiments, each of the gate structures 260 forms the gate associated with the multi-channels provided by the plurality of nanosheets 124 and 144. For example, the high-k/metal gate structures 260 are formed within the openings/spaces O1 provided by the release of nanosheets 124 and 144.

In various embodiments, the high-k/metal gate structure 260 includes a gate dielectric layer 262 formed around the nanosheets 124 and 144 and a gate metal layer 264 formed around the dielectric layer and filling a remainder of gate trenches GT. Formation of the high-k/metal gate structures 260 may include one or more deposition processes to form various gate materials, followed by a CMP processes to remove excessive gate materials, resulting in the high-k/metal gate structures 260 having top surfaces level with a top surface of the dielectric material 250. Thus, transistors (e.g., GAA FET) are formed, and the high-k/metal gate structure 260 surrounds each of the nanosheets 124 and 144, and thus is referred to as a gate of the transistors (e.g., GAA FET).

The gate dielectric layer 262 may include an interfacial layer and a high-k gate dielectric layer over the interfacial layer. In some embodiments, the interfacial layer is silicon oxide formed on exposed surfaces of semiconductor materials in the gate trenches GT by using, for example, thermal oxidation, chemical oxidation, wet oxidation or the like. As a result, surface portions of the layers 124 and 144 and the substrate 110 exposed in the gate trenches GT are oxidized into silicon oxide to form interfacial layer. In some embodiments, the high-k gate dielectric layer includes dielectric materials such as hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO; HZO), lanthanum oxide (LaO), zirconium oxide (ZrO), titanium oxide ($TiO_2$), tantalum oxide ($Ta_2O_5$), yttrium oxide ($Y_2O_3$), strontium titanium oxide ($SrTiO_3$, STO), barium titanium oxide (BaTiO_3, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), the like, or combinations thereof.

In some embodiments, the gate metal layer 264 includes one or more metal layers. For example, the gate metal layer 264 may include one or more work function metal layers stacked one over another and a fill metal filling up a remainder of gate trenches GT. The one or more work function metal layers in the gate metal layer 264 provide a suitable work function for the high-k/metal gate structures GS. For an n-type GAA FET, the gate metal layer 264 may include one or more n-type work function metal (N-metal) layers. The n-type work function metal may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, titanium nitride (TiN), tungsten (W), and/or other suitable materials. On the other hand, for a p-type GAA FET, the gate metal layer 264 may include one or more p-type work function metal (P-metal) layers. The p-type work function metal may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. In some embodiments, the fill metal in the gate metal layer 264 may exemplarily include, but are not limited to, tungsten, aluminum, copper, nickel, cobalt, titanium, tantalum, titanium nitride, tantalum nitride, nickel silicide, cobalt silicide, TaC, TaSIN, TaCN, TiAl, TiAlN, or other suitable materials.

Figure 17:
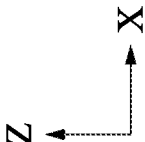

Reference is made to FIG. 17. An interlayer dielectric layer (ILD) 270 is formed over the structure of FIGS. 16A and 16B. In some embodiments, the ILD layer 270 includes materials such as tetraethylorthosilicate (TEOS) oxide, un-doped silicate glass, or doped silicon oxide such as boro-phosphosilicate glass (BPSG), fused silica glass (FSG), phosphosilicate glass (PSG), boron doped silicon glass (BSG), and/or other suitable dielectric materials. The ILD layer 270 may be deposited by a CVD process or other suitable deposition technique. In some embodiments, prior to the formation of the ILD layer 270, an ESL layer may be formed over the structure of FIGS. 16A and 16B. The ESL layer may include includes a silicon nitride layer, a silicon oxynitride layer, and/or other suitable materials having a different etch selectivity than the ILD layer 270. The ESL layer may be formed by plasma-enhanced chemical vapor deposition (PECVD) process and/or other suitable deposition or oxidation processes.

Frontside contact plugs 290 are formed for providing electrical connection to the source/drain epitaxial structures 240. For example, one or more first etching processes are performed to first form contact openings by removing the ILD layer 270, the ILD layer 254, and a bottom portion of the CESL 252. The contact openings may extend through the ILD layer 270, the ILD layer 254, and the CESL 252, and expose top surfaces of the source/drain epitaxial structures 240. Metal alloy layers 280 are respectively formed on portions of the source/drain epitaxial structures 240 exposed by the contact openings. The metal alloy layers 280, which may be silicide layers, are respectively formed in the contact openings and over the exposed frontside of the source/drain epitaxial structures 240, by a self-aligned silicide (salicide) process. The silicide process converts the surface portions of the source/drain epitaxial structures 240 into the silicide contacts. Silicide processing involves deposition of a metal that undergoes a silicidation reaction with silicon (Si). In order to form silicide contacts on the source/drain epitaxial structures 240, a metal material is blanket deposited on the exposed frontside of the source/drain epitaxial structures 240. After heating the wafer to a temperature at which the metal reacts with the silicon of the source/drain epitaxial structures 240 to form contacts, unreacted metal is removed. The silicide contacts remain over the frontside of the source/drain epitaxial structures 240, while unreacted metal is removed from other areas. The silicide layer may include a material selected from titanium silicide, cobalt silicide, nickel silicide, platinum silicide, nickel platinum silicide, erbium silicide, palladium silicide, combinations thereof, or other suitable materials. In some embodiments, the metal alloy layer 280 may include germanium.

Frontside contact plugs 290 are then formed. Each of the contact plugs 290 is formed in the contact opening and in contact with the metal alloy layers 280. As such, each of the contact plug 290 is electrically connected to the source/drain epitaxial structures 240. In some embodiments, each of the contact plugs 290 may include a barrier layer and a fill metal. The barrier layer may be made of TiN, TaN, or combinations thereof. In some embodiments, the fill metal may be made of metal, such as W, Co, Ru, Al, Cu, or other suitable materials. The contact materials can be deposited into the contact opening by suitable deposition processes, such as PVD, ALD, the like, or the combination thereof. After the deposition of the contact materials, a planarization process, such as a chemical mechanical polish (CMP) process, may be then performed.

An interlayer dielectric layer (ILD) 300 is formed over the contact plugs 290. In some embodiments, the ILD layer 300 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 300 may be deposited by a CVD process or other suitable deposition technique. In some embodiments, prior to the formation of the ILD layer 300, an ESL layer may be formed over the contact plugs 290. The ESL layer may include includes a silicon nitride layer, a silicon oxynitride layer, and/or other suitable materials having a different etch selectivity than the ILD layer 300. Conductive vias 310 are formed through the ILD layer 300. In the illustrated embodiments, the conductive vias 310 are formed for providing electrical connection to the contact plugs 390.

A front-side multilayer interconnection (MLI) structure 320 may be formed over the substrate 110. The front-side MLI structure 320 may include a plurality of front-side metallization layers. The number of front-side metallization layers may vary according to design specifications of the integrated circuit. The front-side metallization layers each comprise a front-side inter-metal dielectric (IMD) layer 322, one or more horizontal interconnects, such as front-side metal lines 324, respectively extending horizontally or laterally in the front-side IMD layer, and vertical interconnects, such as front-side conductive vias, respectively extending vertically in the front-side IMD layer.

Figure 18:
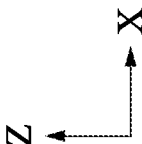

Reference is made to FIG. 18. Backside contact plugs 340 are formed for providing electrical connection to the source/drain epitaxial structures 220. For example, one or more etching processes are performed to form contact openings by removing portions of the substrate 110. The contact openings may expose bottom surfaces of the source/drain epitaxial structures 220. Metal alloy layers 330 are respectively formed on portions of the source/drain epitaxial structures 220 exposed by the contact openings. The metal alloy layers 330, which may be silicide layers, are respectively formed in the contact openings and over the exposed backside of the source/drain epitaxial structures 220 by a self-aligned silicide (salicide) process. The silicide process converts the surface portions of the source/drain epitaxial structures 220 into the silicide contacts. Silicide processing involves deposition of a metal that undergoes a silicidation reaction with silicon (Si). In order to form silicide contacts on the source/drain epitaxial structures 220, a metal material is blanket deposited on the exposed backside of the source/drain epitaxial structures 220. After heating the wafer to a temperature at which the metal reacts with the silicon of the source/drain epitaxial structures 220 to form contacts, unreacted metal is removed. The silicide contacts remain over the backside of the source/drain epitaxial structures 220, while unreacted metal is removed from other areas. The silicide layer may include a material selected from titanium silicide, cobalt silicide, nickel silicide, platinum silicide, nickel platinum silicide, erbium silicide, palladium silicide, combinations thereof, or other suitable materials. In some embodiments, the metal alloy layer 330 may include germanium.

Backside contact plugs 340 are then formed. Each of the contact plugs 340 is formed in the contact opening and in contact with the metal alloy layers 330. As such, each of the contact plug 340 is electrically connected to the source/drain epitaxial structures 220. In some embodiments, each of the contact plugs 340 may include a barrier layer and a fill metal. The barrier layer may be made of TiN, TaN, or combinations thereof. In some embodiments, the fill metal may be made of metal, such as W, Co, Ru, Al, Cu, or other suitable materials. The contact materials can be deposited into the contact opening by suitable deposition processes, such as PVD, ALD, the like, or the combination thereof. After the deposition of the contact materials, a planarization process, such as a chemical mechanical polish (CMP) process, may be then performed. In some embodiments after the formation of the backside contact plugs 340, the substrate 110 (referring to FIG. 17) may be replaced with suitable dielectric materials, such as silicon oxide, silicon nitride, the like, or the combination thereof. For example, the substrate 110 removed by suitable etching process to expose sidewalls of the backside contact plugs 340, and a dielectric structure 350 is formed around the backside contact plugs 340.

An interlayer dielectric layer (ILD) 360 is formed over the contact plugs 340. In some embodiments, the ILD layer 360 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 360 may be deposited by a CVD process or other suitable deposition technique. In some embodiments, prior to the formation of the ILD layer 360, an ESL layer may be formed over the contact plugs 340. The ESL layer may include includes a silicon nitride layer, a silicon oxynitride layer, and/or other suitable materials having a different etch selectivity than the ILD layer 360. Conductive vias 370 are formed through the ILD layer 360. In the illustrated embodiments, the conductive vias 370 are formed for providing electrical connection to the contact plugs 340.

A back-side multilayer interconnection (MLI) structure 380 may be formed. The back-side MLI structure 380 may include a plurality of back-side metallization layers. The number of back-side metallization layers may vary according to design specifications of the integrated circuit. The back-side metallization layers each comprise a back-side inter-metal dielectric (IMD) layer 382, one or more horizontal interconnects, such as back-side metal lines 384, respectively extending horizontally or laterally in the back-side IMD layer, and vertical interconnects, such as back-side conductive vias, respectively extending vertically in the back-side IMD layer.

In the present embodiments, some of the front-side metal lines 342 may serve as power rails for providing a first voltage potential to the top device in the CFET architecture. And, some of the back-side metal lines 384 may serve as power rails for providing a second voltage potential different from the first voltage potential to the bottom device in the CFET architecture. In some embodiments where the nMOS device is stacked on the pMOS device, the power rails of the front-side metal lines 342 and the power rails of the back-side metal lines 384 respectively provide low and high power potentials. In some alternative embodiments where the pMOS device is stacked on the nMOS device, the power rails of the front-side metal lines 342 and the power rails of the back-side metal lines 384 respectively provide high and low power potentials.

Figure 19:
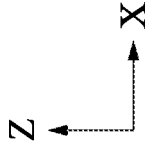
FIG. 19 illustrates a schematic cross-sectional view of an integrated circuit device in accordance with some embodiments of the present disclosure.

FIG. 19 illustrates a schematic cross-sectional view of an integrated circuit device in accordance with some embodiments of the present disclosure. Details of the present embodiments are similar to those illustrated in FIGS. 1-18, except that in the present embodiments, some of the front-side metal lines 342 may serve as power rails for providing a first voltage potential to the top device in the CFET architecture and power rails for providing a second voltage potential to the bottom device in the CFET architecture. In the present embodiments, power conductive features PV may extend through the CFET device for connecting the source/drain epitaxial structures 220 to the front-side metal lines 342. In some embodiments, the power conductive features PV may be a conductive via landing on the front-sides of the source/drain epitaxial structures 220. In some embodiments, the power conductive features PV may be connected to lateral sidewalls of the source/drain epitaxial structures 220. The power conductive features PV may be made of suitable conductive materials. Other details of the present embodiments are similar to those illustrated in FIGS. 1-18, and thereto not repeated herein.

FIGS. 20A-24 illustrate schematic cross-sectional views of intermediate stages in the manufacture of an integrated circuit device in accordance with some embodiments of the present disclosure. Details of the present embodiments are similar to the embodiments of FIGS. 1-18, except that the recesses R1 are etched and formed with a top portion having straight sidewalls and a bottom portion of the recesses R1 tapering down in the epitaxial stacks 120 and 140. Stated differently, no epitaxial layer 210 (referring to FIG. 7A) is formed for adjusting the profile of the recesses R1.

Figure 20A:
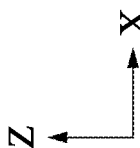

Reference is made to FIGS. 20A, 20B, and 20C. FIG. 20B is an enlarged view of the channel layer 124 in FIG. 20A. FIG. 20C is an enlarged view of the channel layer 144 in FIG. 20A. The recesses R1 is etched such that the channel layer 124 have a the tapered/slant sidewall 124S adjacent the recesses R1, and the channel layer 124 have the vertical sidewall 144S adjacent the recesses R1. In some embodiments, an angle A1' is between the sidewall 124S of the channel layer 124 and a top surface of the substrate 110 and/or channel layer 124, an angle A2 is between the sidewall 144S of the channel layer 144 and a top surface of the substrate 110 and/or the channel layer 144, and the angle A2 is greater than the angle A1'. For example, the angle A1 may be in a range from about 5 degrees to about 60 degrees, and the angle A2 may be in a range from about 80 degrees to about 90 degrees. Stated differently, the recess R1 has an upper sidewall RSU adjacent the epitaxial stack 140 and a lower sidewall RSB adjacent the epitaxial stack 120, and an angle A2 between the upper sidewall RSU and a top surface of the substrate 110 is greater than an angle A1' between the lower sidewall RSB and the top surface of the substrate 110.

Figure 21:
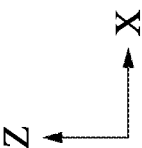

Reference is made to FIG. 21. The sacrificial layers 122 and 142 are laterally or horizontally recessed by using suitable selective etching process, resulting in lateral/sidewall recesses R2 vertically between corresponding channel layers 124, and vertically between corresponding channel layers 144. For example, end surfaces of the sacrificial layers 122 and 142 are recessed by the selective etching process. The various compositions in epitaxial layers result in different oxidation rates and/or etch selectivity, thereby facilitating the selective etching process. In some embodiments, a selective dry etching process is performed by using fluoride-based etchant gas, such as $NF_3$, $SF_6$, the like, or the combination thereof. The fluoride-based gas may etch SiGe at a faster etch rate than it etches Si. The channel layers 124 and 144 may have a higher etch resistance to the selective etching process than that of the sacrificial layers 122 and 142. In some embodiments, the selective etching includes SiGe oxidation followed by a $SiGeO_x$ removal. For example, the oxidation may be provided by an oxygen-containing cleaning process and then $SiGeO_x$ removed by the fluoride-based plasma (e.g., $NF_3$ plasma) that selectively etches $SiGeO_x$ at a faster etch rate than it etches Si. Moreover, because oxidation rate of Si is much lower (sometimes 30 times lower) than oxidation rate of SiGe (or Ge), the channel layers 124 and 144 may not be significantly etched by the process of laterally recessing the sacrificial layers 122 and 142. As a result, the channel layers 124 and 144 laterally extend past opposite end surfaces of the sacrificial layers 122 and 142.

Inner spacers 200 are formed in the recesses R2. Stated differently, the inner spacers 200 may be formed on opposite end surfaces of the laterally recessed sacrificial layers 122 and 142. The inner spacers 200 may include a low-k dielectric material, such as $SiO_x$, SiON, SiOC, SiN, SiCN, or SiOCN. Formation of the inner spacers 200 may include depositing an inner spacer material layer, followed by an anisotropic etching process to trim the deposited inner spacer material layer. Through the anisotropic etching process, only portions of the deposited inner spacer material layer that fill the lateral/sidewall recesses R2 are left. The inner spacers 200 may include a single layer or multiple layers.

Figure 22A:
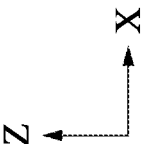

Reference is made to FIG. 22A. An ion implantation process P1 is performed to dope the end portions of the channel layers 124 to form first-type lightly doped regions LDD1'. The ion implantation process P1 may be performed by introducing doping species with a first conductive type. For example, the doping species may include: p-type dopants, such as boron, $BF_2$, gallium; n-type dopants, such as phosphorus, arsenic; other suitable dopants, such as carbon, germanium; and/or the combinations thereof. The ion implantation process P1 may be performed with a dosage ranging from about 5E13 atoms/cm$^2$ to about 1E16 atoms/cm$^2$ and an energy ranging from about 1 keV to about 50 keV at a temperature ranging from −100 Celsius degrees to about 500 Celsius degrees. A depth of the damage layer by the ion implantation process P1 may be in a range from about 1 nanometer to about 15 nanometers. An annealing process may be performed to activate the damage layer, thereby forming the lightly doped regions LDD1'. A dopant concentration of the lightly doped regions LDD1' may be in a range from about 1E20 to about 1E21 atoms/cm$^3$. In some embodiments of the present disclosure, the ion implantation process P1 is performed with a tilt angle ranging from about 0 degree to about 5 degrees. Stated differently, the doping species are almost normally incident into the channel layers 124.

Figure 22B:
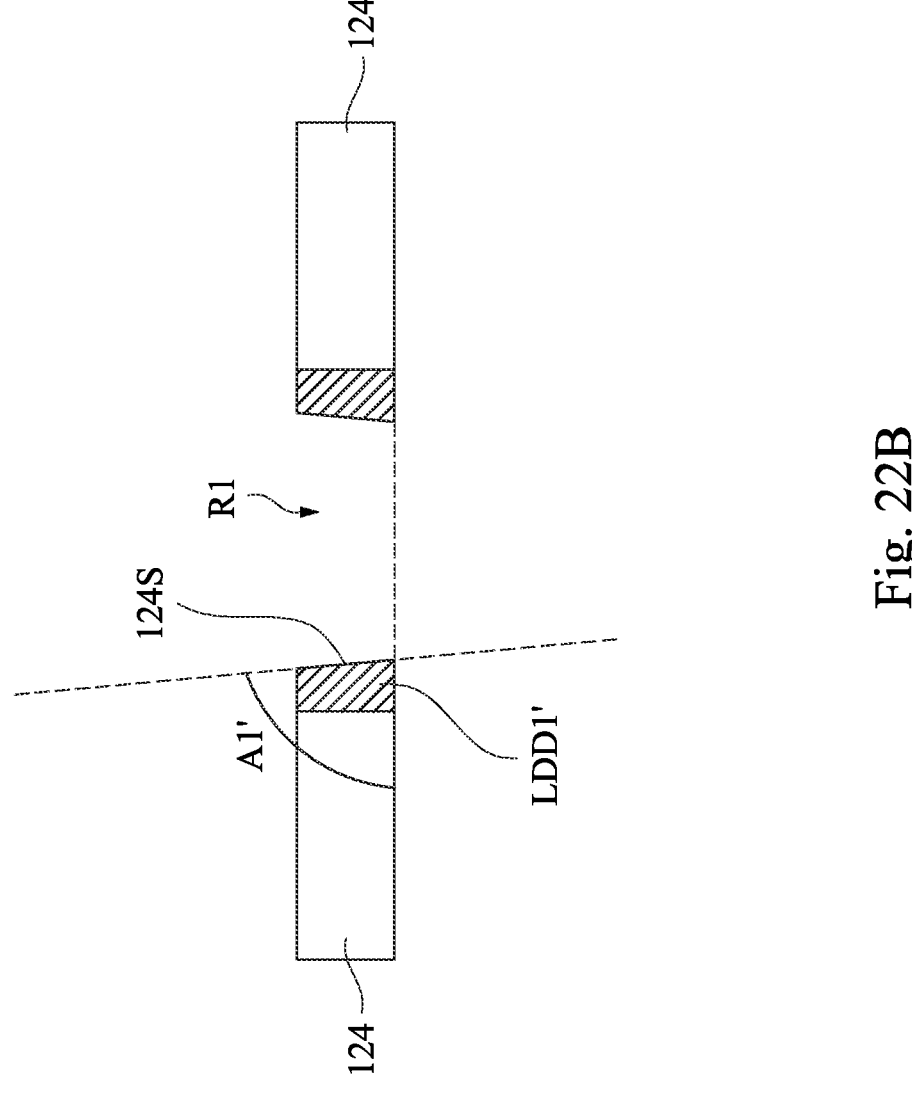

FIG. 22B is an enlarged view of the channel layer 124 in FIG. 22A. With the tapered sidewalls 124S of the channel layers 124, the doping species in the ion implantation process P1 can be received by the end portions of the channel layers 124. As a result, the lightly doped regions LDD1' can be formed adjoining the channel layers 124. In some further embodiments, referring back to FIG. 22A, the ion implantation process P1 may be performed such that the doping species are implanted into the inner spacers 200 on end surfaces of the sacrificial layers 122. In some further embodiments, the ion implantation process P1 may be performed such that the doping species are implanted into a bottom portion of the dielectric layer DL.

Figure 23:
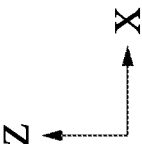

Reference is made to FIG. 23. An ion implantation process P2 (referring to FIG. 9A) is performed to dope the end portions of the channel layers 144 to form second-type lightly doped regions LDD2. Source/drain epitaxial structures 220, the insulating features 230', and the source/drain epitaxial structures 240 are then formed in the recess R1.

Figure 24:
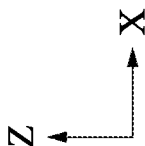

Reference is made to FIG. 24. The dummy gate structure 180 and the sacrificial layer 122 and 142 (referring to FIG. 13) are replaced with a high-k/metal gate structure 260. The frontside contact plugs 290, the frontside conductive vias 310, the front-side MLI structure 320, the backside contact plug 340, the backside conductive vias 370, and the back-side MLI structure 380 are formed. Other details of the present embodiments are similar to those illustrated in the embodiments of FIGS. 1-18, and therefore not repeated herein.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that by designing the source/drain recess to having a top portion with straight sidewalls and a bottom portion tapering down, the lightly doped regions of opposite conductive types can be respectively formed by a normal-incident ion implantation process and a high-tilt ion implantation process. Another advantage is that the lightly doped regions of opposite conductive types can be formed without using additional mask by two implantation process with different tile angles. Still another advantage is that the dopant distribution can be modified by multi-step implant with variable tilt angle. Still another advantage is that vias can be connected from the same side or backside.

According to some embodiments of the present disclosure, a method for fabricating an integrated circuit device, comprising: forming a first epitaxial stack over a substrate, the first epitaxial stack comprising a first sacrificial layer and a first channel layer over the first sacrificial layer; forming a second epitaxial stack over the first epitaxial stack, the second epitaxial stack comprising a second sacrificial layer and a second channel layer over the second sacrificial layer; etching a recess in the second epitaxial stack and the first epitaxial stack, wherein the recess exposes end surfaces of the second channel layer and the first channel layer; performing a first ion implantation process to form a first lightly doped region adjoining the first channel layer; performing a second ion implantation process to form a second lightly doped region adjoining the second channel layer, wherein a tilt angle of the second ion implantation process is greater than a tilt angle of the first ion implantation process; forming a first source/drain epitaxial feature in the recess and adjoining the first lightly doped region; forming a second source/drain epitaxial feature in the recess and adjoining the second lightly doped region; and replacing the first sacrificial layer and the second sacrificial layer with a high-k/metal gate structure.

According to some embodiments of the present disclosure, a method for fabricating an integrated circuit device, comprising: forming a first epitaxial stack over a substrate, the first epitaxial stack comprising a first sacrificial layer and a first channel layer over the first sacrificial layer; forming a second epitaxial stack over the first epitaxial stack, the second epitaxial stack comprising a second sacrificial layer and a second channel layer over the second sacrificial layer; forming a recess in the second epitaxial stack and the first epitaxial stack, wherein the recess has an upper sidewall adjacent the second epitaxial stack and a lower sidewall adjacent the first epitaxial stack, and an angle between the upper sidewall and a top surface of the substrate is greater than an angle between the lower sidewall and the top surface of the substrate; performing a first ion implantation process to form a first lightly doped region adjoining the first channel layer; performing a second ion implantation process to form a second lightly doped region adjoining the second channel layer; forming a first source/drain epitaxial feature in the recess and adjoining the first lightly doped region; forming a second source/drain epitaxial feature in the recess and adjoining the second lightly doped region; and replacing the first sacrificial layer and the second sacrificial layer with a gate structure.

According to some embodiments of the present disclosure, an integrated circuit device includes a first channel layer and a second channel layer above the first channel layer, wherein the first and second channel layers are vertically spaced apart from each other; a first source/drain epitaxial feature adjacent a side of the first channel layer; a second source/drain epitaxial feature adjacent a side of the second channel layer; a first lightly doped region between the first source/drain epitaxial feature and the first channel layer, wherein the first lightly doped region has a first sidewall adjoining the first source/drain epitaxial feature; a second lightly doped region between the second source/drain epitaxial feature and the second channel layer, wherein the second lightly doped region has a second sidewall adjoining the second source/drain epitaxial feature, and an angle between the second sidewall and a top surface of the second channel layer is greater than an angle between the first sidewall and the top surface of the first channel layer; and a gate structure wrapping around the first and second channel layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating an integrated circuit device, comprising:

forming a first epitaxial stack over a substrate, the first epitaxial stack comprising a first sacrificial layer and a first channel layer over the first sacrificial layer;

forming a second epitaxial stack over the first epitaxial stack, the second epitaxial stack comprising a second sacrificial layer and a second channel layer over the second sacrificial layer;

etching a recess in the second epitaxial stack and the first epitaxial stack, wherein the recess exposes end surfaces of the second channel layer and the first channel layer;

performing a first ion implantation process to form a first lightly doped region adjoining the first channel layer;

after performing the first ion implantation process, performing a second ion implantation process to form a second lightly doped region adjoining the second channel layer, wherein a tilt angle of the second ion implantation process is greater than a tilt angle of the first ion implantation process;

forming a first source/drain epitaxial feature in the recess and adjoining the first lightly doped region;

forming a second source/drain epitaxial feature in the recess and adjoining the second lightly doped region; and replacing the first sacrificial layer and the second sacrificial layer with a high-k/metal gate structure.

2. The method of claim 1, wherein the first lightly doped region has a first conductive type different from a second conductive type of the second lightly doped region.

3. The method of claim 1, wherein the tilt angle of the first ion implantation process is in a range from 0 degree to 5 degrees.

4. The method of claim 1, wherein the tilt angle of the second ion implantation process is in a range from 40 degree to 80 degrees.

5. The method of claim 1, further comprising:

depositing a semiconductor layer into the recess prior to the first ion implantation process, wherein the semiconductor layer has a tapered sidewall facing away from the first channel layer.

6. The method of claim 5, wherein an angle between the tapered sidewall of the semiconductor layer and a top surface of the substrate is in a range from 5 degrees to 60 degrees.

7. The method of claim 1, further comprising:

forming a channel isolation dielectric between the first and second epitaxial stack.

8. The method of claim 1, further comprising:

forming a blocking feature over the first source/drain epitaxial feature, wherein forming the second source/drain epitaxial feature is performed such that the second source/drain epitaxial feature is over the blocking feature.

9. A method for fabricating an integrated circuit device, comprising:

forming a first epitaxial stack over a substrate, the first epitaxial stack comprising a first sacrificial layer and a first channel layer over the first sacrificial layer;

forming a second epitaxial stack over the first epitaxial stack, the second epitaxial stack comprising a second sacrificial layer and a second channel layer over the second sacrificial layer;

forming a recess in the second epitaxial stack and the first epitaxial stack, wherein the recess has an upper sidewall adjacent the second epitaxial stack and a lower sidewall adjacent the first epitaxial stack, and an angle between the upper sidewall and a top surface of the substrate is greater than an angle between the lower sidewall and the top surface of the substrate;

performing a first ion implantation process to form a first lightly doped region adjoining the first channel layer;

after performing the first ion implantation process, performing a second ion implantation process to form a second lightly doped region adjoining the second channel layer;

forming a first source/drain epitaxial feature in the recess and adjoining the first lightly doped region;

forming a second source/drain epitaxial feature in the recess and adjoining the second lightly doped region; and replacing the first sacrificial layer and the second sacrificial layer with a gate structure.

10. The method of claim 9, wherein the angle between the upper sidewall and the top surface of the substrate is in a range from 80 degrees to 90 degrees.

11. The method of claim 9, wherein the angle between the lower sidewall and the top surface of the substrate is in a range from 5 degrees to 60 degrees.

12. The method of claim 9, wherein forming the recess in the second epitaxial stack and the first epitaxial stack comprises:

etching a recess in the second epitaxial stack and the first epitaxial stack; and depositing a semiconductor layer into the recess, wherein the semiconductor layer is in contact with the first channel layer but not with the second channel layer.

13. The method of claim 12, wherein the semiconductor layer has a sidewall thickness decreasing as a distance from the substrate increases.

14. The method of claim 9, wherein a tilt angle of the second ion implantation process is greater than a tilt angle of the first ion implantation process.

15. The method of claim 9, wherein the first lightly doped region has a first conductive type different from a second conductive type of the second lightly doped region.

16. A method comprising:

forming a first epitaxial stack over a substrate, the first epitaxial stack comprising a first sacrificial layer and a first channel layer over the first sacrificial layer;

forming a middle semiconductor layer over the first epitaxial stack;

forming a second epitaxial stack over the middle semiconductor layer, the second epitaxial stack comprising a second sacrificial layer and a second channel layer over the second sacrificial layer;

etching a recess in the first and second epitaxial stacks and the middle semiconductor layer;

removing the middle semiconductor layer such that a space is between the first and second epitaxial stacks;

after removing the middle semiconductor layer, forming a middle dielectric layer in the space between the first and second epitaxial stacks;

performing a first ion implantation process to form a first lightly doped region adjoining the middle dielectric layer and the first channel layer;

after performing the first ion implantation process, performing a second ion implantation process to form a second lightly doped region adjoining the middle dielectric layer and the second channel layer;

forming a first source/drain epitaxial feature in the recess and adjoining the first lightly doped region;

forming a second source/drain epitaxial feature in the recess and adjoining the second lightly doped region; and replacing the first sacrificial layer and the second sacrificial layer with a gate structure.

17. The method of claim 16, wherein the second lightly doped region is formed in the second channel layer and the middle dielectric layer.

18. The method of claim 16, wherein the first lightly doped region is formed in the first channel layer and the middle dielectric layer.

19. The method of claim 16, wherein a tilt angle of the second ion implantation process is greater than a tilt angle of the first ion implantation process.

20. The method of claim 16, further comprising:

depositing a semiconductor layer into the recess prior to the first ion implantation process, wherein the semiconductor layer has a tapered sidewall facing away from the first channel layer.

\* \* \* \* \*